United States Patent
Feldman et al.

(10) Patent No.: US 8,153,957 B2
(45) Date of Patent: Apr. 10, 2012

(54) INTEGRATED OPTICAL IMAGING SYSTEMS INCLUDING AN INTERIOR SPACE BETWEEN OPPOSING SUBSTRATES AND ASSOCIATED METHODS

(75) Inventors: Michael R. Feldman, Huntersville, NC (US); Brian Harden, Charlotte, NC (US); Alan D. Kathman, Charlotte, NC (US); W. Hudson Welch, Charlotte, NC (US)

(73) Assignee: DigitalOptics Corporation East, Charlotte, NC (US)

( * ) Notice: Subject to any disclaimer, the term of this patent is extended or adjusted under 35 U.S.C. 154(b) by 252 days.

(21) Appl. No.: 11/928,060

(22) Filed: Oct. 30, 2007

(65) Prior Publication Data

US 2008/0111058 A1 May 15, 2008

(51) Int. Cl.
*H01J 40/14* (2006.01)
(52) U.S. Cl. .............. 250/239; 250/237 G; 438/64
(58) Field of Classification Search .............. 250/239, 250/237 G; 438/64
See application file for complete search history.

(56) References Cited

U.S. PATENT DOCUMENTS

| | | | |
|---|---|---|---|
| 3,579,816 A | 5/1971 | Ingraham | |
| 3,674,004 A | 7/1972 | Grandia et al. | |
| 3,691,707 A | 9/1972 | Von Arx et al. | |
| 3,698,080 A | 10/1972 | Berner | |
| 4,222,070 A | 9/1980 | Howe et al. | |
| 4,626,103 A | 12/1986 | Feldman et al. | |
| 4,636,080 A | 1/1987 | Feldman et al. | |
| 4,672,187 A | 6/1987 | Fujita et al. | |
| 4,731,155 A | 3/1988 | Napoli et al. | |
| 4,737,447 A | 4/1988 | Suzuki et al. | |
| 4,769,108 A | 9/1988 | Deppe et al. | |
| 4,813,762 A | 3/1989 | Leger et al. | |
| 4,866,694 A | 9/1989 | Korth | |
| 5,025,165 A | 6/1991 | Chen et al. | |
| 5,034,083 A | 7/1991 | Campanelli et al. | |
| 5,056,881 A | 10/1991 | Bowen et al. | |
| 5,061,025 A | 10/1991 | Debesis | |

(Continued)

FOREIGN PATENT DOCUMENTS

DE 196 12 576 10/1996

(Continued)

OTHER PUBLICATIONS

Lee, Wai-Hon, "Holographic Optical Head for Compact Disk Applications," Pencom International Corporation vol. 28, No. 6, Jun. 1989.

(Continued)

*Primary Examiner* — Georgia Y Epps
*Assistant Examiner* — Kevin Wyatt
(74) *Attorney, Agent, or Firm* — Lee & Morse, P.C.

(57) ABSTRACT

An integrated optical imaging system includes a first substrate having first and second opposing surfaces, a second substrate having third and fourth opposing surfaces, a spacer between a substantially planar portion of the third surface of the second substrate and a substantially planar portion of the second surface of the first substrate, at least two of the spacer, the first substrate and the second substrate sealing an interior space between the third surface of the second substrate and the second surface of the first substrate, and an optical imaging system having n surfaces, where n is greater than or equal to two, at least two of the n surfaces of the optical imaging system are on respective ones of the first, second, third and fourth surfaces.

29 Claims, 11 Drawing Sheets

U.S. PATENT DOCUMENTS

| | | | |
|---|---|---|---|
| 5,111,343 A | 5/1992 | Harrigan | |
| 5,157,001 A | 10/1992 | Sakuma | |
| 5,159,473 A | 10/1992 | Feldman | |
| 5,161,059 A | 11/1992 | Swanson et al. | |
| 5,168,324 A | 12/1992 | Hackel et al. | |
| 5,170,269 A | 12/1992 | Lin et al. | |
| 5,171,392 A | 12/1992 | Iida et al. | |
| 5,182,055 A | 1/1993 | Allison et al. | |
| 5,189,485 A | 2/1993 | Hackel et al. | |
| 5,202,775 A | 4/1993 | Feldman et al. | |
| 5,204,516 A | 4/1993 | Opheij | |
| 5,214,535 A | 5/1993 | Harris et al. | |
| 5,229,883 A | 7/1993 | Jackson et al. | |
| 5,237,434 A | 8/1993 | Feldman et al. | |
| 5,237,451 A | 8/1993 | Saxe | |
| 5,283,434 A * | 2/1994 | Ishizuka et al. | 250/237 G |
| 5,284,538 A | 2/1994 | Suzuki et al. | |
| 5,309,282 A | 5/1994 | Feldman et al. | |
| 5,330,799 A | 7/1994 | Sandor et al. | |
| 5,337,398 A | 8/1994 | Benzoni et al. | |
| 5,422,746 A | 6/1995 | Aharoni et al. | |
| 5,446,814 A | 8/1995 | Kuo et al. | |
| 5,448,014 A | 9/1995 | Kong et al. | |
| 5,465,265 A | 11/1995 | Ota | |
| 5,499,262 A | 3/1996 | Nakata | |
| 5,499,312 A | 3/1996 | Hahn et al. | |
| 5,499,732 A | 3/1996 | Mishimoto | |
| 5,504,350 A | 4/1996 | Ortyn | |
| 5,552,009 A | 9/1996 | Zager et al. | |
| 5,552,328 A | 9/1996 | Orlowski et al. | |
| 5,568,574 A | 10/1996 | Tanguay, Jr. et al. | |
| 5,575,878 A | 11/1996 | Cox et al. | |
| 5,583,843 A * | 12/1996 | Horinouchi | 369/112.1 |
| 5,597,613 A | 1/1997 | Galarneau et al. | |
| 5,608,233 A | 3/1997 | Sahara et al. | |
| 5,621,715 A | 4/1997 | Ohyama | |
| 5,630,902 A | 5/1997 | Galarneau et al. | |
| 5,638,469 A | 6/1997 | Feldman et al. | |
| 5,652,744 A | 7/1997 | Freeman et al. | |
| 5,666,196 A * | 9/1997 | Ishii et al. | 356/499 |
| 5,687,155 A | 11/1997 | Fukakusa et al. | |
| 5,703,861 A | 12/1997 | Matsuda | |
| 5,712,841 A | 1/1998 | Opheij et al. | |
| 5,727,009 A | 3/1998 | Tajiri et al. | |
| 5,748,658 A * | 5/1998 | Nakanishi et al. | 372/43.01 |
| 5,764,832 A | 6/1998 | Tabuchi | |
| 5,768,023 A * | 6/1998 | Sawaki et al. | 359/622 |
| 5,768,031 A | 6/1998 | Yang | |
| 5,771,218 A | 6/1998 | Feldman et al. | |
| 5,772,905 A | 6/1998 | Chou | |
| 5,774,239 A | 6/1998 | Feldman et al. | |
| 5,790,730 A | 8/1998 | Kravitz et al. | |
| 5,798,557 A * | 8/1998 | Salatino et al. | 257/416 |
| 5,805,556 A | 9/1998 | Lee et al. | |
| 5,929,962 A * | 7/1999 | Chiu et al. | 349/187 |
| 6,027,595 A | 2/2000 | Suleski | |
| 6,066,218 A | 5/2000 | Kuhn et al. | |
| 6,320,257 B1 * | 11/2001 | Jayaraj et al. | 257/723 |
| 6,610,166 B1 | 8/2003 | Harden et al. | |
| 2002/0150341 A1 * | 10/2002 | Te Kolste et al. | 385/48 |
| 2004/0012698 A1 * | 1/2004 | Suda et al. | 348/315 |
| 2004/0023469 A1 * | 2/2004 | Suda | 438/458 |

FOREIGN PATENT DOCUMENTS

| | | |
|---|---|---|
| EP | 0 123 048 | 10/1984 |
| EP | 0 164 834 | 12/1985 |
| EP | 0 175 460 | 3/1986 |
| EP | 0426 441 | 5/1991 |
| EP | 0 510 750 A1 | 10/1992 |
| EP | 0 581 519 A2 | 2/1994 |
| EP | 0 658 779 | 6/1995 |
| EP | 0 731 417 A | 9/1996 |
| FR | 2725547 | 4/1996 |
| JP | 0035701 | 2/1985 |
| JP | 0118103 | 5/1989 |
| JP | 6-318625 A | 11/1994 |
| JP | 08-124204 | 9/1996 |
| JP | 9251663 | 9/1997 |
| WO | WO/9311453 | 6/1993 |

OTHER PUBLICATIONS

Sasaki, et al. "Marker Alignment Method for Passive Laser Coupling on Silicon Waferboard," Ieice Transactions on Communications, vol. E79-B, No. 7, pp. 939-942, Jul. 1996.

\* cited by examiner

INTEGRATED OPTICAL IMAGING SYSTEMS INCLUDING AN INTERIOR SPACE BETWEEN OPPOSING SUBSTRATES AND ASSOCIATED METHODS

CROSS REFERENCES TO RELATED APPLICATIONS

This application claims the benefit of priority under 35 U.S.C. §120 to U.S. application Ser. No. 08/727,837, filed Sep. 27, 1996 (now U.S. Pat. No. 5,771,218), Ser. No. 08/917,865, filed Aug. 27, 1997, (now U.S. Pat. No. 6,128,134), Ser. No. 08/943,274, filed Oct. 3, 1997 (now U.S. Pat. No. 6,096,155), Ser. No. 09/018,891, filed Feb. 5, 1998 (now U.S. Pat. No. 5,912,872), Ser. No. 09/503,249, filed Feb. 14, 2000 (now U.S. Pat. No. 6,610,166), Ser. No. 09/637,364, filed Aug. 15, 2000 (now U.S. Pat. No. 6,522,618), and pending Ser. No. 10/647,262, filed Aug. 26, 2003, which are hereby incorporated by reference in their entirety for all purposes.

FIELD OF THE INVENTION

The present invention is directed to integrating multiple optical elements on a wafer level. In particular, the present invention is directed to efficient creation of integrated multiple elements.

BACKGROUND OF THE INVENTION

As the demand for smaller optical components to be used in a wider variety of applications increases, the ability to efficiently produce such optical elements also increases. In forming such integrated multiple optical elements at a mass production level, the need for accurate alignment increases. Further, such alignment is critical when integrating more than one optical element.

Integrated multiple optical elements are multiple optical elements stacked together along the z-axis, i.e., the direction of the light propagation. Thus, light traveling along the z-axis passes through the multiple elements sequentially. These elements are integrated such that further alignment of the elements with themselves is not needed, leaving only the integrated element to be aligned with a desired system, typically containing active elements.

Many optical systems require multiple optical elements. Such required multiple optical elements include multiple refractive elements, multiple diffractive elements and refractive/diffractive hybrid elements. Many of these multiple element systems were formed in the past by bonding individual elements together or bonding them individually to an alignment structure.

In bulk or macroscopic optics to be mounted in a machined alignment structure formed using a mechanical machining tools, the typical alignment precision that can be achieved is approximately 25-50 microns. To achieve a greater level of 15-25 microns, active alignment is required. Active alignment typically involves turning on a light source, e.g., a laser, and sequentially placing each optic down with uncured ultraviolet (UV) adhesive. Then each part is moved, usually with a translation stage, until the appropriate response from the laser is achieved. Then the part is held in place and the epoxy is cured with UV light, thereby mounting the element. This is done sequentially for each element in the system.

Alignment accuracies of less than 15 microns for individual elements can be achieved using active alignment, but such accuracies greatly increase the amount of time spent moving the element. This increase is further compounded when more than one optical element is to be aligned. Thus, such alignment accuracy is often impractical even using active alignment.

In many newer applications of optics, as in the optical head configuration set forth in U.S. Pat. Nos. 5,771,218 and 6,522,618, which are hereby incorporated by reference, and the integrated beam shaper application noted above, there is a need to make optical systems composed of several micro-optical components and in which the tolerances needed are much tighter than can be achieved with conventional approaches. In addition to requiring tight tolerances, elements of lower cost are also demanded. The alignment tolerance needed may be 1 micron to 5 microns, which is very expensive to achieve with conventional methods. Unfortunately, these active alignment requirements are complex, time consuming, and relatively expensive. Further, the level of size reduction in the vertical direction of an optical head is limited. In addition, the relatively large size of the elements of an optical head which can be manipulated is determined by the need for active alignment.

To achieve greater alignment tolerances, passive alignment techniques have been used as set forth in U.S. Pat. No. 5,683,469 to Feldman entitled "Microelectronic Module Having Optical and Electrical Interconnects". One such passive alignment technique is to place metal pads on the optics and on the laser and place solder between them and use self-alignment properties to achieve the alignment. When solder reflows, surface tension therein causes the parts to self-align. However, passive alignment has not been employed for wafer-to-wafer alignment. In particular, the high density of solder bumps required and the thickness and mass of the wafer make such alignment impractical.

Another problem in integrating multiple optical elements formed on separate wafers at a wafer level arises due to the dicing process for forming the individual integrated elements. The dicing process is messy due to the use of a dicing slurry. When single wafers are diced, the surfaces thereof may be cleaned to remove the dicing slurry. However, when the wafers are bonded together, the slurry enters the gap between the wafers. Removing the slurry from the gap formed between the wafers is quite difficult.

Integrated elements are also sometimes made by injection molding. With injection molding, plastic elements can be made having two molded elements located on opposite sides of a substrate. Multiple plastic elements can be made simultaneously with a multi-cavity injection molding tool.

Glass elements are also sometimes made by molding, as in U.S. Pat. No. 4,883,528 to Carpenter entitled "Apparatus for Molding Glass Optical Elements". In this case, just as with plastic injection molding, multiple integrated elements are formed by molding two elements on opposite sides of a substrate. Glass molding however has disadvantages of being expensive to make tooling and limited in size that can be used.

To make optics inexpensive, replication techniques are typically used. In addition to plastic injection molding and glass molding discussed above, individual elements may also be embossed. An example of such embossing may be found in U.S. Pat. No. 5,597,613 to Galarneau entitled "Scale-up Process for Replicating Large Area Diffractive Optical Elements". Replicated optics have not been used previously together with solder self-alignment techniques. For each replication method, many individual elements are generated as inexpensively as possible.

Such replication processes have not been used on a wafer level with subsequent dicing. This is primarily due to the stresses imposed on the embossed layer during dicing. When using embossing on a wafer level, unique problems, such as keeping the polymer which has been embossed sufficiently attached to the substrate, e.g., such that the alignment, especially critical on the small scale or when integrating more than one element, is not upset.

Further, these replication processes are not compatible with the wafer level photolithographic processes. In particular, replication processes do not attain the required alignment accuracies for photolithographic processing. Even if embossing was compatible with lithographic processing, it would be too expensive to pattern lithographically on one element at a time. Further, the chemical processing portion of lithographic processing would attack the embossing material.

Other problems in embossing onto plastic, as is conventionally done, and lithographic processing arise. In particular, the plastic is also attacked by the chemicals used in lithographic processing. Plastic also is too susceptible to warping due to thermal effects, which is detrimental to the alignment required during lithographic processing.

SUMMARY OF THE INVENTION

Therefore, it is a feature of an embodiment to provide an integrated optical system that substantially overcomes one or more of the problems due to the limitations and disadvantages of the related art.

It is a feature of an embodiment to integrate optics on the wafer level.

It is another feature of an embodiment to integrate optics with an optoelectronic device.

It is yet another feature of an embodiment to integrate optics with an optoelectronic device forming a system having a reduced thickness.

At least one of the above and other features and advantages may be realized by providing an integrated optical imaging system, including a first substrate having first and second opposing surfaces, a second substrate having third and fourth opposing surfaces, a spacer between a substantially planar portion of the third surface of the second substrate and a substantially planar portion of the second surface of the first substrate, at least two of the spacer, the first substrate and the second substrate sealing an interior space between the third surface of the second substrate and the second surface of the first substrate, and an optical imaging system having n surfaces, where n is greater than or equal to two, at least two of the n surfaces of the optical imaging system are on respective ones of the first, second, third and fourth surfaces.

The optical imaging system may be on at least two of the first, second, third and fourth surfaces. The spacer may be bonding material between the first and second substrates. The spacer may be opaque.

The integrated optical imaging system may include a detector in optical communication with the optical imaging system. The detector may be within the interior space. The detector may be an array of detectors. The optical imaging system may include an array of lenses, each lens associated with a corresponding detector. The array of lenses may be within the interior space. Each lens may focus an image on the corresponding detector.

The integrated optical imaging system may include a third substrate associated with the detector. The detector may be mounted on the third substrate. The first through third substrates may be secured together, e.g., on a wafer level. The first and second substrates may be secured on a wafer level via the spacer. The integrated optical imaging system may include a second spacer between the third substrate and the second substrate, the second spacer, the third substrate and the second substrate forming a second interior space in which the detector is enclosed.

The first and second substrates may be secured on a wafer level via the spacer. The optical imaging system may include a refractive element. The refractive element may be a replica. The optical imaging system may include first and second optical elements in a same optical path and on different ones of the first through fourth surfaces, the first optical element being a replica and the second optical element being a lithograph.

At least one of the above and other features and advantages may be realized by providing a method of making an integrated optical imaging system, including providing a first substrate having first and second opposing surfaces, providing a second substrate having third and fourth opposing surfaces, providing a spacer between a substantially planar portion of the third surface of the second substrate and a substantially planar portion of the second surface of the first substrate, at least two of the spacer, the first substrate and the second substrate sealing an interior space between the third surface of the second substrate and the second surface of the first substrate, and providing an optical imaging system having n surfaces, where n is greater than or equal to two, at least two of the n surfaces of the optical imaging system are on respective ones of the first, second, third and fourth surfaces.

BRIEF DESCRIPTION OF THE DRAWINGS

The above and other features and advantages of embodiments will become readily apparent to those of skill in the art by describing in detail embodiments thereof with reference to the attached drawings, in which.

DETAILED DESCRIPTION OF EMBODIMENTS

Figure 1:
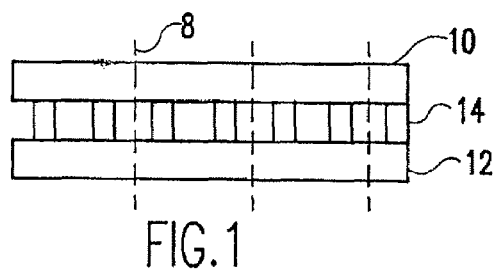
FIG. 1 illustrates a first embodiment for bonding together two wafers.

In the drawings, the thickness of layers and regions may be exaggerated for clarity. It will also be understood that when a layer is referred to as being "on" another layer or substrate, it may be directly on the other layer or substrate, or intervening layers may also be present. Further, it will be understood that when a layer is referred to as being "under" another layer, it may be directly under, or one or more intervening layers may also be present. In addition, it will also be understood that when a layer is referred to as being "between" two layers, it may be the only layer between the two layers, or one or more intervening layers may also be present. Like numbers refer to like elements throughout. As used herein, the term "wafer" is to mean any substrate on which a plurality of components are formed on a planar surface which are to be separated through the planar surface prior to final use.

As can be seen in FIG. 1, a first substrate wafer 10 and a second substrate wafer 12 are to be bonded together in order to provide integrated multiple optical elements. A wafer may be a disc, typically 4, 6, 8, or 12 inches in diameter and typically having a thickness between 400 microns and 6 mm.

These wafers have an array of respective optical elements formed thereon on either one or both surfaces thereof. The individual optical elements may be either diffractive, refractive or a hybrid thereof. Dashed lines 8 indicate where the dicing is to occur on the wafers to provide the individual integrated elements.

A bonding material 14 is placed at strategic locations on either substrate in order to facilitate the attachment thereof. By surrounding the optical elements which are to form the final integrated die, the adhesive 14 forms a seal between the wafers at these critical junctions. During dicing, the seal prevents dicing slurry from entering between the elements, which would result in contamination thereof. Since the elements remain bonded together, it is nearly impossible to remove any dicing slurry trapped therebetween. The dicing slurry presents even more problems when diffractive elements are being bonded, since the structures of diffractive elements tend to trap the slurry.

Preferably, an adhesive or solder can be used as the bonding material 14. Solder is preferable in many applications because it is smoother than adhesives and allows easier movement prior to bonding. Adhesives have the advantages of being less expensive for a number of applications, they can be bonded with or without heating, they do not suffer with oxidation, and they can be transparent.

When using a fluid adhesive as the bonding material, the viscosity of the fluid adhesive is important. The adhesive cannot be too thin, or else it beads, providing indeterminant adhesion, allowing the dicing slurry to get in between the elements on the wafers, thereby contaminating the elements. The adhesive cannot be too thick, or the restoring force is too great and sufficient intimate contact between the substrates 10 and 12 to be bonded is not achieved. The fluid adhesive preferably has a viscosity between 1,000 and 10,000 centipoise. Satisfactory epoxies include Norland 68 and Masterbond UV 15-7.

When a fluid adhesive is employed, it must be provided in a controlled manner, such as ejected from a nozzle controlled in accordance with the desired coordinates to receive the fluid adhesive. After alignment of the wafers, the entire assembly is cured, thereby hardening the fluid adhesive and completing the bonding.

When solder is used, an electroplating or sputtering process may be employed. For example, a masking material may be put over the substrate wherever the substrate is not to have solder. Then the entire wafer is placed into a bath or sputtering chamber. Then solder is placed over the entire wafer and the masking material is pulled off, leaving solder where there was no masking material. Once the wafers are appropriately aligned, the solder is then heated up to reflow. The solder is cooled and allowed to re-harden, thereby completing the bond.

When using the bonding material used alone as shown in FIG. 1 is a fluid adhesive, a more viscous adhesive is needed in order to ensure that the bonding material remains where it is deposited. Even using a viscous adhesive, the adhesive still typically spreads over a relatively large area, resulting in a need for a larger dead space between elements to be integrated to accommodate this spread without having the adhesive interfere with the elements themselves.

It is also difficult to control the height of the adhesive when the adhesive is used alone. This results in the amount of adhesive being overcompensated and the height of the adhesive, and hence the separation between the wafers, often being greater than desired. The difficulty controlling the height of the adhesive also results in air being trapped within the space containing the optical elements. This arises from the uncertainty as to the height and the timing of when a vacuum is pulled on the wafer pair. This air is undesirable, as it may expand upon heating and disrupt the bond of the elements.

Figure 2:
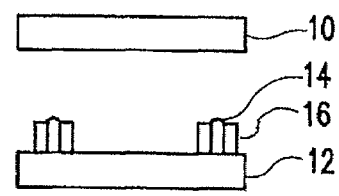
FIG. 2 illustrates a second embodiment for bonding together two wafers.

Therefore, an advantageous alternative is shown in FIG. 2, in which only an individual integrated optical element of the wafer is shown. Stand offs 16 for each element to be integrated are etched or replicated into the bottom substrate wafer 12 at the same time the array of optical elements are made for the substrate wafer 12, and typically will be of the same material as the substrate wafer. These stand offs 16 preferably include a trench formed between two surfaces in which the adhesive 14 is to be placed. These trenches then provide precise spacing between the substrates to be bonded and provide more of a bonding surface to which the adhesive 14 can adhere. This increased surface area also reduces beading problems.

When solder is used as the bonding material 14, solid stand-offs are preferably used to provide the desired separation between the wafers. The solder is then deposited in a thin, e.g., 4-5 micron, layer on top of the stand-offs. While the solder could be used alone as shown in FIG. 1, it is more feasible and economical to use the solder in conjunction with stand-offs.

The use of the stand-offs allows a more uniform and predictable height to be obtained, resulting in less air being trapped between the bonded elements. A vacuum may now be pulled just before or at contact between the bonding material and the other substrate, due to the reduction in variability of the separation.

The substrate not containing the stand-offs may have notches formed thereon to receive the stand-offs 16 therein. These notches can be formed at the same time any optical elements on that surface are formed. In such a configuration, the stand-offs 16 and the corresponding notches will serve as alignment features, facilitating alignment of the wafers to one another.

Figure 3A:
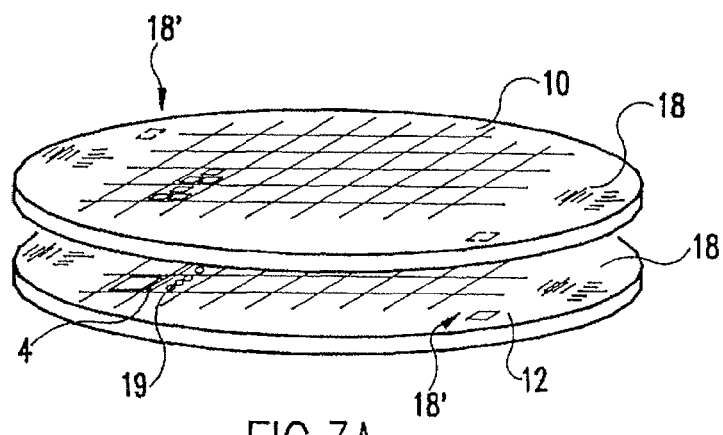
FIG. 3A illustrates a perspective view of wafers to be bonded.

FIG. 3A shows the two substrates 10 and 12 prior to being bonded and diced. The individual optical elements 19 to be integrated may consist of one or more optical elements. Further, the optical elements on the wafers may be identical, or may differ from one another. Prior to joining the wafers 10, 12, the bonding material 14 is placed on at least one of the wafers in the manner described above. Advantageously, both substrates 10 and 12 include fiducial marks 18 somewhere thereon, most likely at an outer edge thereof, to ensure alignment of the wafers so that all the individual elements thereon are aligned simultaneously. Alternatively, the fiducial marks 18 may be used to create mechanical alignment features 18' on the wafers 11, 12. One or both of the fiducial marks 18 and the alignment features 18' may be used to align the wafers.

Figure 3B:
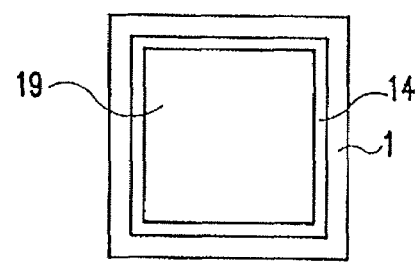
FIG. 3B illustrates a top view of an individual die on a wafer to be bonded.

FIG. 3B shows a top view of a substrate 12 to be bonded including the location of the surrounding bonding material 14 for a particular element 19. As can be seen from this top view, the bonding material 14 is to completely surround the individual optical element, indicated at 19.

For either embodiment shown in FIG. 1 or 2, the bonding material provided either directly or using stand-offs completely seals each element to be individually utilized. Thus, when dicing a wafer in order to perform the individual elements, dicing slurry used in the dicing process is prevented from contaminating the optical elements. Thus, in addition to providing a structural component to maintain alignment and rigidity during dicing, the bonding material seal also makes the dicing a much cleaner process for the resultant integrated dies.

Figure 4A:
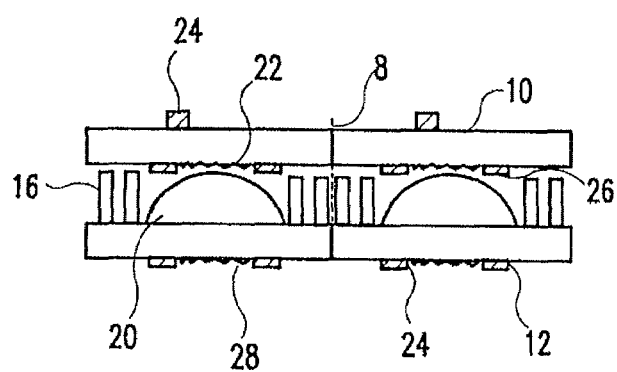
FIGS. 4A-4B illustrate specific examples of bonding two substrates together.

A specific example of integrated multiple optical elements is shown in FIG. 4A. A refractive 20 is formed on a surface of the first substrate 12. A diffractive 22 is formed on a surface of the other substrate 10. A diffractive 28 may also be formed on a bottom surface of either substrate. The stand offs 16 forming the trenches for receiving the adhesive 14 are formed at the same time as a refractive lens.

Figure 4B:
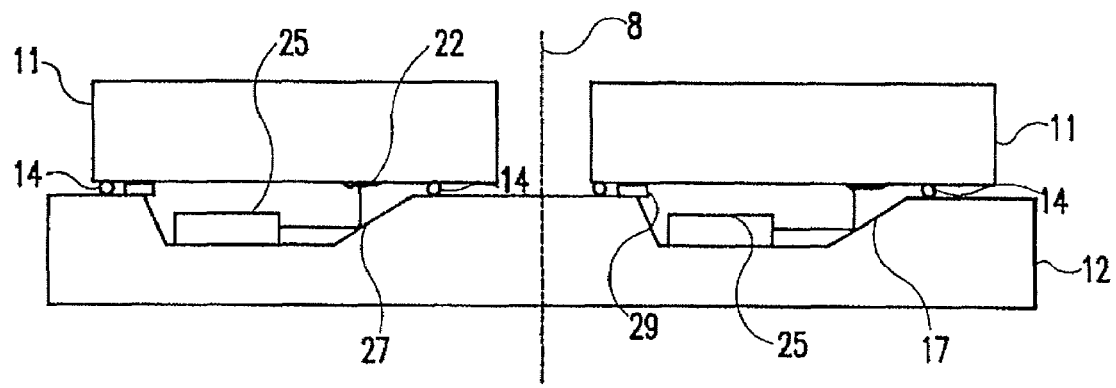

Another specific example of integrated multiple optical elements is shown in FIG. 4B. An active element 25, e.g., a laser, is provided on the first substrate 12. The first substrate 12 may be etched to provide a reflective surface 27, 17 therein. The second substrate 11, which has been separated to form dies with diffractive elements 22 thereon, may be mounted to the first substrate 12 via the adhesive 12. Stand-offs 29 may be provided to insure alignment between the reflective surface 27, 17, the active element 25 and the diffractive element 22

When the lens 20 on the wafer 12 is directly opposite the other wafer, the vertex of the lens 20 may also be used to provide the appropriate spacing between the substrates 10 and 12. If further spacing is required, the stand offs 16 may be made higher to achieve this appropriate spacing.

In addition to using the fiducial marks 18 shown in FIG. 3A for alignment of the substrates 10, 12, the fiducial marks 18 may also be used to provide metalized pads 24 on opposite sides of the substrates rather than their bonding surfaces in order to facilitate alignment and insertion of the integrated multiple optical element into its intended end use. Such metal pads are particularly useful for mating the integrated multiple optical elements with an active or electrical element, such as in a laser for use in an optical head, a laser pointer, a detector, etc. Further, for blocking light, metal 26 may be placed on the same surface as the diffractive 22 itself using the fiducial marks 18.

It is to be understood that any of the optical designs of embodiments may be realized by vertically stacking of n/2 substrates may provide up to n parallel surfaces on which optical elements may be created. Further, even with optical elements formed on the surface, substantially planar regions may remain on the surfaces, facilitating securing thereof with adjacent surfaces.

Figure 5:
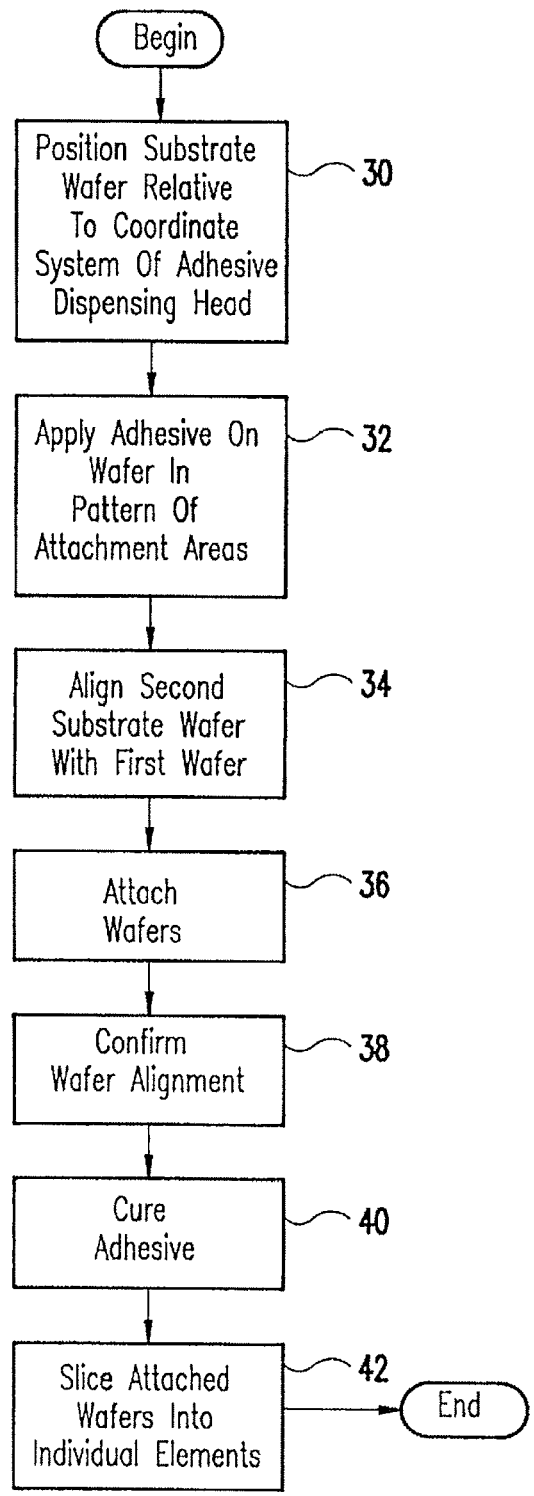
FIG. 5 is a flow chart of the bonding process of an embodiment.

FIG. 5 shows a flow chart of the general process of bonding together two wafers in accordance with the present invention. In step 30, a substrate wafer is positioned relative to the bonding material to be distributed. In step 32, the bonding material is applied to the wafer in a pattern to provide sealing around the optical elements, either directly or with the stand-offs 16. In step 34, the second substrate wafer is aligned with the first substrate wafer. Just before contact is achieved, a vacuum is pulled to remove air from between the substrates. In step 36, the wafers are brought into contact. In step 38, the alignment of the two wafers is confirmed. In step 40, the adhesive is cured or the solder is reflowed and then allowed to harden. Once firmly bonded, in step 42, the bonded wafers are diced into the individual elements.

The elements to be bonded together are preferably created by direct photolithographic techniques, as set forth, for example, in U.S. Pat. No. 5,161,059 to Swanson, which is hereby incorporated by reference, for the diffractive optical elements, or in creating the spherical refractive elements by melting a photoresist as taught in O. Wada, "Ion-Beam Etching of InP and its Application to the Fabrication of High Radiance InGAsP/InP Light Emitting Diodes," General Electric Chemical Society, Solid State Science and Technology, Vol. 131, No. 10, October 1984, pages 2373-2380, or making refractive elements of any shape employing photolithographic techniques used for making diffractive optical elements when the masks used therein are gray scale masks such as high energy beam sensitive (HEBS) or absorptive gray scale masks, disclosed in provisional application Ser. No. 60/041,042, filed on Apr. 11, 1997, which is hereby incorporated by reference.

Figure 6B:
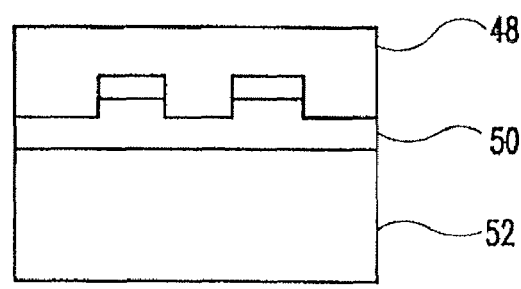
FIG. 6B illustrates embossing an embossable material on a support substrate using a master element.

Alternatively, these photolithographic techniques may be used to make a master element 48 in glass which in turn may then be used to stamp out the desired element on a wafer level in a layer of embossable material 50 onto a substrate 52 as shown in FIG. 6B. The layer 50 is preferably a polymer, while the substrate 52 may be glass, e.g., fused silica, or plastic, preferably polycarbonate or acrylic. The polymer is preferably a UV curable acrylate photopolymer having good release from a master and good adherence to a substrate such that it does not crack after cure or release from the substrate during dicing. Suitable polymers include PHILIPS type 40029 Resin or GAFGARD 233. Dashed lines 58 indicate the dicing lines for forming an individual integrated element from the wafer.

Figure 6A:
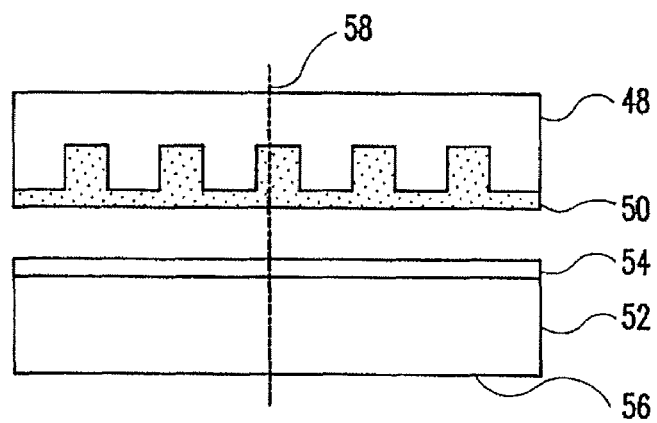
FIG. 6A illustrates embossing an embossable material onto a support substrate using a master element.

In the embodiment shown in FIG. 6A, the layer of embossable material 50 is provided on the master element 48. A layer of adhesion promoter 54 is preferably provided on the substrate 52 and/or a layer of a release agent is provided on the master element 48 in between the master element and the embossing material. The use of an adhesion promoter and/or release agent is of particular importance when the master and the substrate are of the same material or when the master naturally has a higher affinity for adhesion to the embossable material.

The type of adhesion promoter used is a function of the photopolymer to be used as the embossable material, the master material and the substrate material. A suitable adhesion promoter for use with a glass substrate is HMDS (hexamethyl disilizane). This adhesion promoter encourages better bonding of the embossable material onto the substrate 52, which is especially critical when embossing on the wafer level, since the embossed wafer is to undergo dicing as discussed below.

The provision of the embossable layer 50 on the master 48 and of the adhesion promoting layer 54 on the substrate 52 advantageously provides smooth surfaces which are to be brought into contact for the embossing, making the elimination of air bubbles easier as noted below. The provision of the embossable layer on the master 48 also provides a convenient mechanism for maintaining alignment of contacted, aligned wafer which have not been bonded, as discussed below.

If either the substrate or the master is made of plastic, it is preferable to place the polymer on the other non-plastic component, since plastic absorbs strongly in the UV region used for activating the polymer. Thus, if the UV radiation is required to pass through plastic, a higher intensity beam will be required for the desired effect, which is clearly less efficient.

The use of embossing on the wafer level is of particular interest when further features are to be provided on the wafer using lithographic processes, i.e., material is selecting added to or removed from the wafer. Such further features may include anti-reflective coatings or other features, e.g. metalization pads for aligning the die diced from the substrate 52 in a system, on the embossed layer. Any such features may also be lithographically provided on an opposite surface 56 of the substrate 52.

Typically an anti-reflective coating would be applied over the entire surface, rather than selectively. However, when using both an anti-reflective coating and metal pads, the metal would not adhere as well where the coating is present and having the coating covering the metal is unsatisfactory. Further, if the wafer is to be bonded to another wafer, the bonding material would not adhere to the surface of having such an anti-reflective coating, thereby requiring the selective positioning of the coating.

For achieving the alignment needed for performing lithographic processing in conjunction with the embossing, fiducial marks as shown in FIG. 3 may be provided on both the substrate 52 and the master 48. When performing lithographic processing, the alignment tolerances required thereby make glass more attractive for the substrate than plastic. Glass has a lower coefficient of thermal expansion and glass is flatter than plastic, i.e., it bows and warps less than plastic. These features are especially critical when forming elements on a wafer level.

When placing the master on the substrate, the wafer cannot be brought straight down into contact. This is because air bubbles which adversely affect the embossed product would be present, with no way of removing them.

Therefore, in bringing the master into contact with the substrate, the master initially contacts just on one edge of the substrate and then is rotated to bring the wafer down into contact with the substrate. This inclined contact allows the air bubbles present in the embossable material to be pushed out of the side. Since the master is transparent, the air bubbles can be visually observed, as can the successful elimination thereof. As noted above, it is the presence of these air bubbles which make it advantageous for the surfaces to be brought into contact be smooth, since the diffractive formed on the surface of the master 48 could trap air bubbles even during such inclined contact.

The degree of the inclination needed for removing the air bubbles depends on the size and depth of the features being replicated. The inclination should be large enough so that the largest features are not touching the other wafer across the entire wafer on initial contact.

Alternatively, if the replica wafer is flexible, the replica wafer may be bowed to form a slightly convex surface. The master is then brought down in contact with the replica wafer in the center and then the replica wafer is released to complete contact over the entire surface, thereby eliminating the air bubbles. Again, the amount of bow required is just enough such that the largest features are not touching the other wafer across the entire wafer on initial contact.

When using the fiducial marks themselves to align the master element 48 to the glass substrate 52 in accordance with the present invention, a conventional mask aligner may be used in a modified fashion. Typically in a mask aligner, a mask is brought into contact with a plate and then a vacuum seals the mask and plate into alignment. However, a vacuum cannot be created when a liquid, such as a polymer, embossable material is on top of a wafer. Therefore, the above inclined contact is used. Once contact is established, the wafers are aligned to one another in a conventional fashion using the fiducial marks before being cured.

Further, the intensity required to cure the polymer is very high, e.g., 3-5 W/cm$^2$, and needs to be applied all at once for a short duration, e.g., less than 30 seconds. If enough energy and intensity are not applied at this time, hardening of the polymer can never be achieved. This is due to the fact that the photoinitiators in the polymer may be consumed by such incomplete exposure without full polymerization. However, it is not easy to provide such a high intensity source with the mask aligner. This is due both to the size and the temperature of the high energy light source required. The heat from the high energy source will cause the mask aligner frame to warp as it is exposed to thermal variations. While the mask aligner could be thermally compensated or could be adapted to operate at high temperatures, the following solution is more economical and provides satisfactory results.

In addition to the inclined contact needed for placing the master in full contact with the substrate in the mask aligner, once such full contact is achieved, rather than curing the entire surface, a delivery system, such as an optical fiber, supplies the radiation from a UV source to the master-substrate in contact in the mask aligner. The delivery system only supplies UV radiation to individual spots on the polymer.

The delivery system is small enough to fit in the mask aligner and does not dissipate sufficient heat to require redesign of the mask aligner. When using an optical fiber, these spots are approximately 2 mm. Alternatively, a UV laser which is small and well contained, i.e., does not impose significant thermal effects on the system, may be used.

The delivery system provides the radiation preferably to spots in the periphery of the wafer in a symmetric fashion. For a 4 inch wafer, only about 6-12 spots are needed. If additional spots are desired for increased stability, a few spots could be placed towards the center of the wafer. These spots are preferably placed in the periphery and a minimal number of these spots is preferably used since an area where a tack spot is located does not achieve as uniform polymerization as the areas which have not been subjected to the spot radiation.

These tack spots tack the master in place with the substrate. The illumination used for curing the tack spots is only applied locally and there are few enough of these tack spots such that the area receiving the illumination is small enough to significantly affect the rest of the embossable material. Once alignment has been achieved and the master tacked into place, the substrate-master pair is removed from the aligner and then cured under the high intensity UV source over the entire surface for full polymerization. The tack spots prevent shifting of the alignment achieved in the mask aligner, while allowing the substrate-master pair to be removed from the mask aligner to thereby use the high energy light source external to the mask aligner for curing the polymer.

Alternatively, the fiducial marks may be used to form mechanical alignment features on the perimeter of the surfaces to be contacted. The mechanical alignment features may provide alignment along any axis, and there may be more than one such mechanical alignment feature. For example, the stand-offs in FIG. 4 are for aligning the wafers along the y axis, while the metal pads provide alignment of the wafer pair to additional elements along the x and z axes. The alignment features are preferably formed by the embossing itself.

The embossing and the lithographic processing on the opposite surface may be performed in either order. If the embossing is performed first, it is advantageous to leave the master covering the embossed layer until the subsequent processing on the opposite surface is complete. The master will then act as a seal for the embossed structure, protecting the polymer from solvents used during lithographic processing and keeping the features accurate throughout heating during lithographic processing.

If the lithographic processing is performed first, then more precise alignment is required during embossing to provide sufficient alignment to the photolithographic features than is required during normal embossing. Thus, embossing equipment is not set up to perform such alignment. Then, the above alignment techniques are required during embossing.

Once all desired processing has been completed, the wafer is diced to form the individual elements. Such dicing places mechanical stresses on the embossed wafer. Therefore, full polymerization and sufficient adhesion of the embossed portion to the substrate is of particular importance so that the embossed portion does not delaminate during dicing. Therefore, care must be taken in selecting the particular polymer, an adhesion promoter, and the substrate, and how these elements interact. Preferably, in order to avoid delamination of the embossed layer during dicing, the adhesion of the polymer to the substrate should be approximately 100 grams of shear strength on a finished die.

When both wafers to be bonded together as shown in FIGS. 1-4 have been embossed with a UV cured polymer, the typical preferred use of a UV epoxy for such bonding may no longer be the preferred option. This is because the UV cured polymer will still highly absorb in the UV region, rendering the available UV light to cure the epoxy extremely low, i.e., in order to provide sufficient UV light to the epoxy to be cured, the intensity of the UV light needed is very high. Therefore, the use of thermally cured resin to bond such wafers is sometimes preferred.

Alternatively, polymer on the portions not constituting the elements themselves may be removed, and then the UV epoxy could be employed in these cleared areas which no longer contain the UV polymer to directly bond the glass substrate wafer having the UV polymer with another wafer. A preferably way to remove the polymer includes provides a pattern of metal on the master. This metal blocks light, thereby preventing curing of the polymer in the pattern. When a liquid polymer is used, this uncured polymer may then be washed away. Other materials, such as the UV epoxy for wafer-to-wafer bonding or metal for active element attachment or light blocking, may now be placed where the polymer has been removed.

Figure 7:
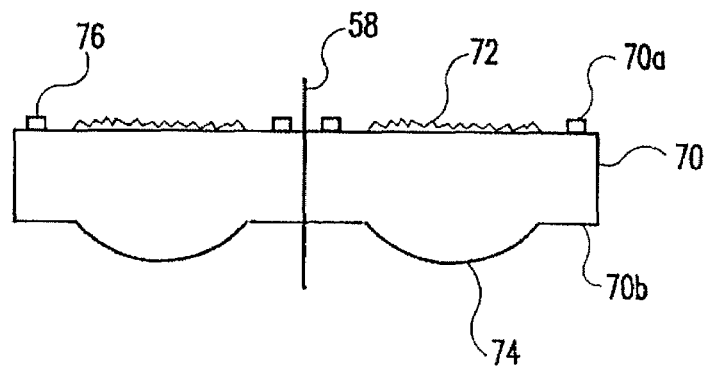
FIG. 7 illustrates a wafer on which optical elements have been formed on both sides.

In addition to the bonding of the two substrates shown in FIGS. 1-4, the alignment marks may be used to produce optical elements on the other side of the substrate itself, at shown in FIG. 7. The creation may also occur by any of the methods noted above for creating optical elements. The double sided element 70 in FIG. 7 has a diffractive element 72 on a first surface 70a thereof and a refractive element 74 on a second surface 70b thereof, but any desired element may be provided thereon. Again, metal pads 76 may be provided through lithographic processing on the hybrid element.

Figure 8:
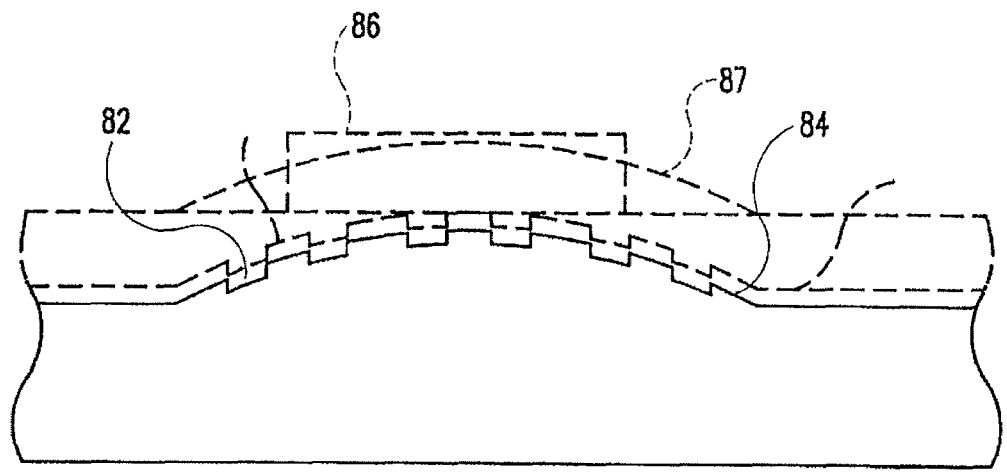
FIG. 8 illustrates a cross-sectional view of a substrate having a hybrid element consisting of a microlens with a diffractive element integrated directly thereon.

A further configuration of an integrated multiple optical elements is shown in FIG. 8, in which a diffractive element 82 is formed directly on a refractive element 84. The refractive element may be made by any of the above noted photolithographic techniques. In the specific example shown in FIG. 8, the refractive element is formed by placing a circular layer of photoresist 86 on a surface of optical material using a mask. The photoresist is then partially flowed using controlled heat so that the photoresist assumes a partially spherical shape 87. Thereafter, the surface is etched and a refractive element 84 having substantially the same shape as the photoresist 87 is formed by the variable etch rate of the continually varying thickness of the photoresist 87. The microlens 84 is then further processed to form the diffractive element 82 thereon. The diffractive element may be formed by lithographic processing or embossing.

The wafers being aligned and bonded or embossed may contain arrays of the same elements or may contain different elements. Further, when alignment requirements permit, the wafers may be plastic rather than glass. The integrated elements which are preferred to be manufactured on the wafer level in accordance with the present invention are on the order of 100 microns to as large as several millimeters, and require alignment accuracies to ±1-2 microns, which can be achieved using the fiducial marks and/or alignment features of the present invention.

When the optical elements are provided on opposite surfaces of a substrate, rather than bonded facing one another, tolerable alignment accuracies are ±10 microns. This is due to the fact that when light is transmitted through the thickness of the glass, slight amounts of tilt can be corrected or incorporated.

As an alternative to the fiducial marks used for passive alignment, the fiducial marks may be used to create mechanical alignment features, such as corresponding groves joined by a sphere, metalization pads joined by a solder ball, and a bench with a corresponding recess. Only a few of these alignment features is needed to align an entire wafer.

All of the elements of the present invention are advantageously provided with metalized pads for ease of incorporation, including alignment, into a system, typically including active elements. The metalized pads may efficiently be provided lithographically on the wafer level.

An example of active elements, i.e., optoelectronic elements, to be incorporated with the optical elements made in accordance with any of the above embodiments is illustrated below with reference to an optical head.

Figure 9A:
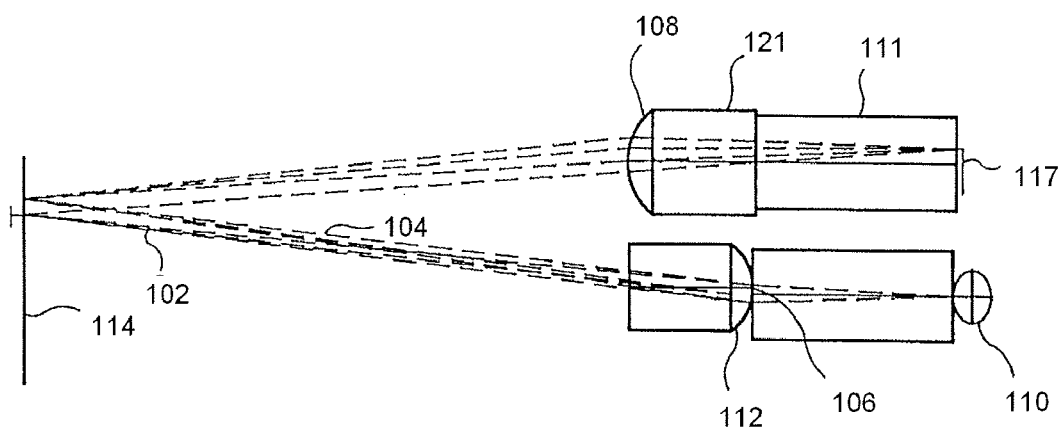
FIG. 9A illustrates a schematic view of a configuration of an integrated optical apparatus in accordance with an embodiment.

FIG. 9A illustrates an optical design schematic of an integrated assembly including a light source 110, a transmit diffractive optical element (DOE) 106, a transmit refractive lens 112, a return refractive lens 108 and a detector 117. These elements are integrated onto transparent substrates. Light output by the light source 110 is split into a plurality of light beams by the DOE 106. These beams are delivered to a target surface 114 via the transmit refractive lens 112. In FIG. 9A, two beams 102, 104 are shown as an example, although any number may be used. These beams are reflected by the target surface to the detector 17 via the return refractive lens 8. The detector may include more than one detector, one for each beam, or a single detector with unique areas designated for each beam.

When the light source is a laser, it is preferably the semiconductor laser chip itself, i.e., not a laser inside a can as typically provided for a macroscopic system. Since the dimensions of the integrated system are much smaller than those for a conventional macroscopic system, the light source must be fairly close to the DOE 106, so that the beam will not be too large thereon and all of the beam will be received by the DOE 106. Thus, part of the integrated approach of the present invention preferably includes providing the laser chip or die itself adjacent to a transparent substrate.

In forming an integrated optical apparatus, the first design was to attempt to simply scale down a macroscopic design. In other words, a single lens was placed in the return path, as shown in FIG. 9A. In a macroscopic configuration, this lens in the return path provides both separation to the beams as well as focusing thereof in order to properly deliver them to the detector.

In the transmit path from the light source to the detector, the light from the light source 110 is delivered to the DOE on the top surface of the substrate 111 at a distance from the light source 110. This distance is used to advantage to provide an adequately wide beam at the DOE. The beams formed by the DOE are focused on surface 114 located at a distance from the lens 112. This distance is chosen to achieve adequate spot size modulation depth and depth of focus at the media surface.

In the return path from the target 114 to the detector 117, the 110 refractive lens 118 is located at a distance d2 from the target and the detector 117 is located a distance d1 from the refractive lens 118. The distances d1, d2 are dictated by the substrates 111, 121 on which these elements are mounted. The ratio of the distances d1/d2 determines the amount of demagnification of the image reflected from the media that occurs in a lens. In using a single lens in the return path, this demagnification affects not only spot size but spot spacing. Assuming, for example, a spot size of 0.020 mm on the target 114, a demagnification of ¼ gives a spot size of 0.005 mm which because of aberration is spread to an area 0.025 mm. When a single lens in the return path is used, as shown in FIG. 9A, the spacing of the spots is demagnified to 0.025 mm and significant crosstalk noise results. This can be seen by the overlapping beams in the plane of the detector 117 in FIG. 9A. The overlapping of the beams also occurs at the return refractive lens 118. In order for the refractive lens to image the beams at a point at which they are sufficiently separated such that the beams will be distinguishable on the detector 117, the return refractive lens 118 would have to be placed closer to the target 114. However, such positioning would destroy the desired integrated nature of the optical apparatus.

In this configuration, in order for the return refractive lens 118 to properly focus the beams, the angles of the beams 102, 104 need to be as small as possible and as similar as possible, so that these beams may both impinge upon a central portion of the return refractive lens 118. In the relative scale of FIG. 9A, using the distances from the top surface of the top substrates to the target, the angle of beam 102 is 5.6 degrees and the angle of beam 104 is 6.9 degrees. However, the beams 102, 104 also need to be sufficiently separated on the detector 117. These two design constraints cannot be met using the single refractive lens 118 for receiving all of the beams in the return path while providing an integrated optical apparatus.

Figure 9B:
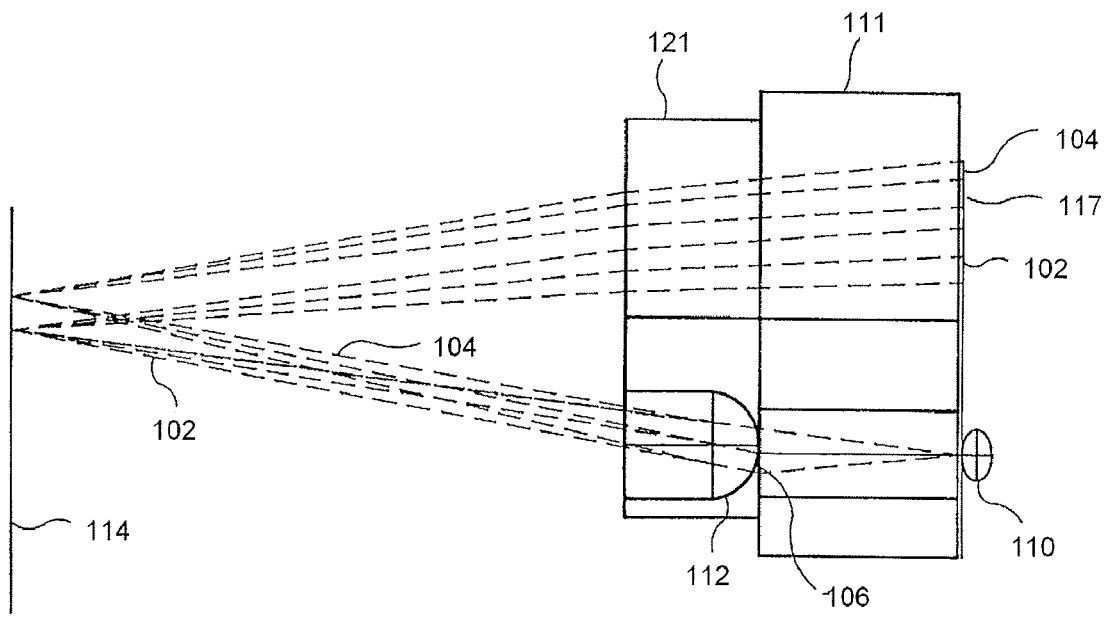
FIG. 9B illustrates a schematic view of another configuration of an integrated optical apparatus in accordance with an embodiment.

FIG. 9B is an alternative configuration created by recognizing that by providing larger angles to the light beams and providing greater difference between the angles of the light beams, the need for an optical element in the return path so could be eliminated. In other words, the separation between the light beams 102, 104 in FIG. 9B is sufficient such that the beams remain separate and distinguishable on the detector 117 without requiring an optical element in the return path to provide this separation. In FIG. 9B, the angle of beam 102 is 8 degrees and the angle of beam 104 is 11 degrees.

In FIG. 9B, the distance between the top surfaces of the top substrates and the target 114 is the same as it was in FIG. 9A. This clearly results in the beams being further separated on the target 114. For many applications, this increased separation is not a problem, but for those for which a particular separation is desired, the integrated optical head can be positioned closer to the target 114.

Figure 9C:
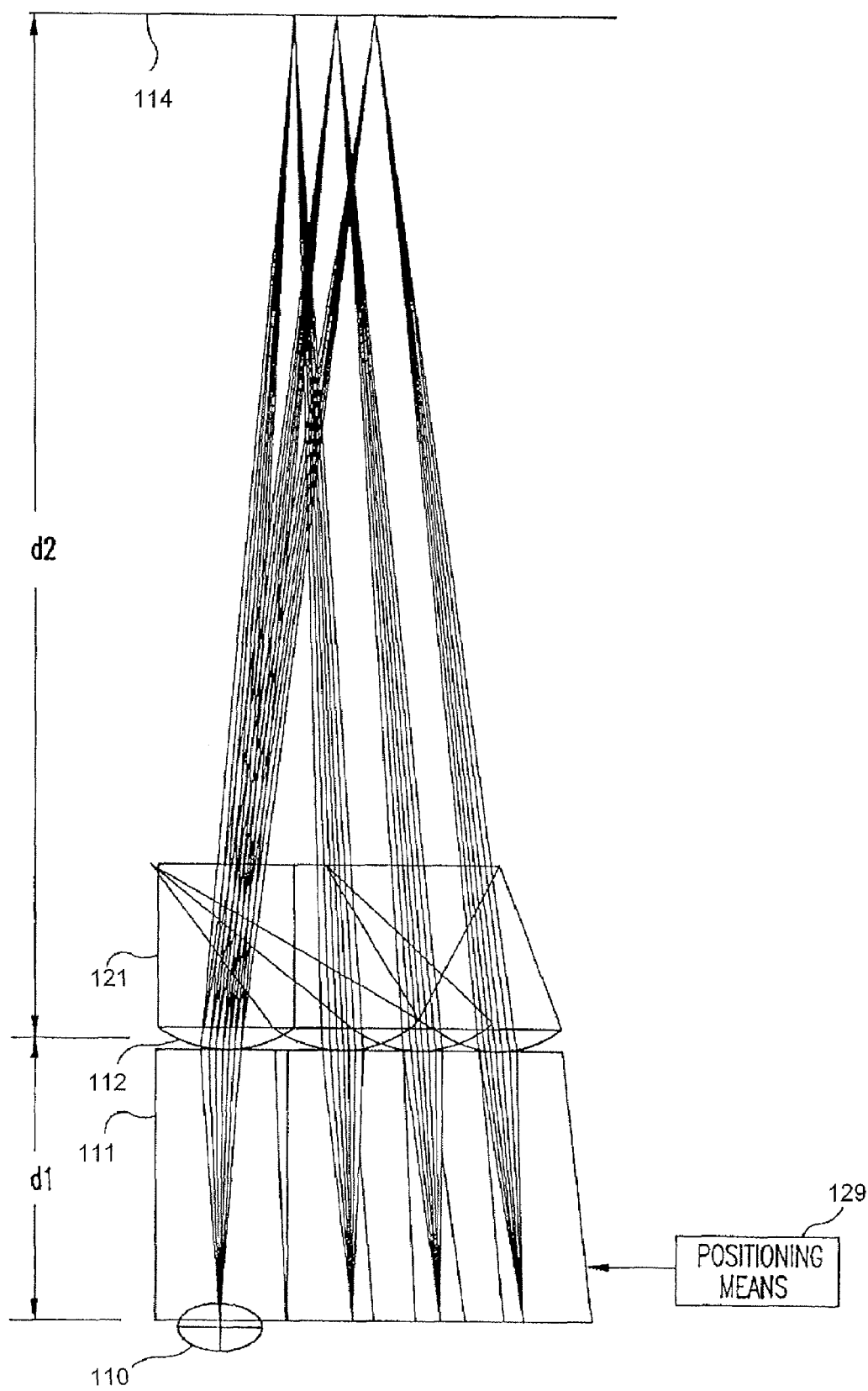
FIG. 9C illustrates a schematic view of an integrated optical apparatus according to an embodiment.

While the configuration shown in FIG. 9B is advantageous for integrated apparatuses, for many applications, the complete elimination of optical elements in the return path results in an unacceptable level of noise. A solution, an example of which is shown in FIG. 9C is to include separate optical elements for each beam in the return path. The ability to use more than one optical element in the return path can be realized due to the increased separation between the beams. The feasibility of such a solution, requiring more than one optical element for each beam, is facilitated by the passive alignment discussed in detail below.

FIG. 9C is an optical design schematic of an assembly according to the invention for use in, for example, detecting an optical track on a storage media. A light source 110 directs coherent light, with a dispersion angle of fifteen degrees, upward through an object distance d1 through a diffractive element (DOE) not shown and to a refractive lens 112. The DOE divides the light into a number of beams, only three of which are shown as a plurality of rays in FIG. 9C. The beams are focused on surface 114 located at an image distance from the lens 112. The spot size and spacing of the light on the image surface 114 determines the tracking accuracy and therefore the amount of information that can be stored on the media. The size to which the spot can be reduced is in the instant design, approximately 0.020 mm. In the design of FIG. 9C, the refractive lens 112 must have a significant curvature in order to focus the light to 0.020 mm spots on the media. The spots of light are spaced approximately 0.100 mm from each other on the media to limit crosstalk noise. As would be readily understood by those skilled in the art the optical head can be positioned by the illustrated positioning means 129.

Preferably, all optical elements needed to create the more than one beam, direct the beams onto the target and direct the beams from the target to the detector are on the substrate and/or any structure bonded thereto, thereby providing an integrated optical apparatus. Preferably, any optical elements in both the return path and the transmit path are less than 500 microns in diameter, more preferably, less than 300 microns in diameter. The actual size of the elements will be dictated by the overall size of the device with which the integrated optical apparatus is to be used, with a lower practical limit being on the order of a wavelength.

If a design were attempted using a single lens as taught in the prior art where the elements are not integrated, the lens curvature required to focus the laser light to 0.020 mm spots in this compact architecture would control the dimensions of the single lens. Thus the use of a single lens as taught in the prior art for reducing the size of optical heads, is a limiting factor in size reduction of the entire optical head assembly. This factor is one of the reasons that multiple lenses are employed in the instant invention instead of a single lens. The use of multiple lenses is enabled by having the separation between the beams be sufficient so that each beam is incident only on one of the lenses in the return path.

The ratio of the distances d1/d2 determines the amount of demagnification of the image reflected from the media that occurs in a lens. In a single lens design, this demagnification affects not only spot size but spot spacing. A demagnification of ¼ gives a spot size of 0.005 mm which because of aberration is spread to an area 0.025 mm. If a single lens design had been used, the spacing of the spots would also have been demagnified to 0.025 mm and significant crosstalk noise would result. By using individual lenses, spaced approximately 0.200 mm, the detectors can be spaced at about 0.220 mm and thereby eliminate crosstalk noise using the 0.025 mm light spots.

Thus, by providing increased separation to the beams in the transmit path, separate optical elements for each beam's return path may be used, thus allowing proper focusing of the beams on the detector. Further, such separate elements are more readily integrated into a compact system. In an integrated system, it is advantageous to place the grating on the media as close to the light source as possible, but separation between the beams needs to be maintained. If the distance is too small, in order to maintain the separation, a bigger angular deflection is required. Then the beams are more spread out and the system will become too large in the x-y direction (with z being in the plane of the paper). This spread also increases the aberrations. Therefore, the angles need to be as small as possible, while maintaining separation even over the small distance from the light source and to the detector.

Figure 10:
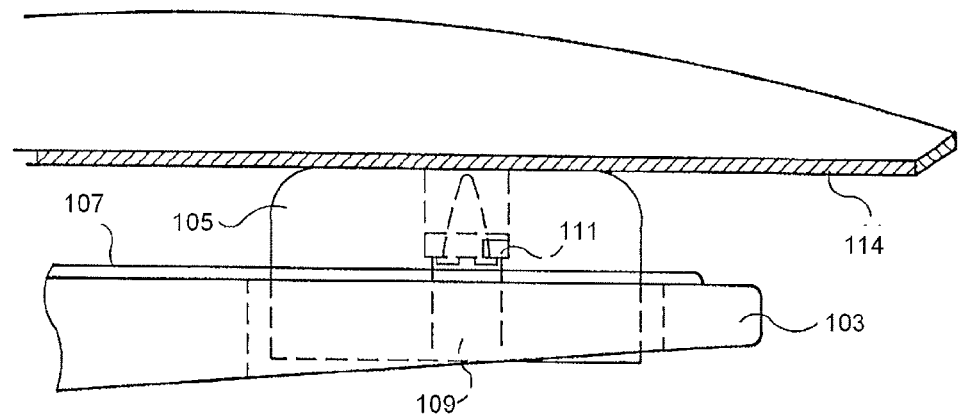
FIG. 10 illustrates a fragmentary side perspective view of an integrated optical apparatus according to an embodiment.

FIG. 10 is a side view of a magnetic floppy disk head 105 with an optical tracking assembly according to a preferred embodiment of the invention. Head 105 is mounted, in arm 103 by known means not shown, for the extension across the various tracks of media 114. Head 105 is electrically connected to read and write circuits and tracing control circuits by a flexible printed circuit 107. A recess 9 of approximately two millimeters by one point six millimeters and four and a half or five millimeters deep is provided in head 105 in which the optical assembly comprising substrate 111 is mounted and connected to flexible printed circuit 107. It will be appreciated that the same assembly techniques and methods of the invention may be used to assemble optical disk read heads, as well as magnetic disk heads with optical tracking.

Referring now to FIG. 11, a first transparent substrate 111 comprising fused silica or other optical material has component mounting metalized pads or contact pads placed on its bottom surface 113, such as using substrate fiducial marks or indicia and accurately aligned photolithographic masks and metal deposition steps known in the art of microelectronic circuit manufacture. In this preferred embodiment, surface 113 of substrate 111 is approximately 1.6 mm by 2 mm and the substrate 111 is approximately 0.8 mm thick. A laser chip 115 is mounted to the surface 113 by means of some of the mentioned metalized pads. As shown in FIG. 11, laser 115 is an edge emitting laser with the laser light directed upwards through means of a precision mirror 133 as shown in FIG. 12. It will by understood that the edge emitting laser 115 can be replaced with a vertical cavity surface emitting laser and thereby obviate the need for the precision mirror in order to direct the laser beam normal to the substrate surface.

An optical detector chip 117 is also mounted to the component surface of substrate 111 by means of the metalized pads. A hologram surface 119 on the opposite side of substrate 111 carries the diffractive optical elements shown in detail in FIG. 14. The diffractive optical element phase profiles are designed using the computer calculations and manufactured using techniques taught by Swanson et al. in U.S. Pat. No. 5,161,059, the entire disclosure of which is incorporated herein by reference.

The optical elements are created photolithographically using the same fiducial marks or indicia used to place the metalized pads. Alternately second fiducial marks that have been aligned with the first marks may be used to align the masks that are also used to create the optical elements. In this way, when the light source, mirror and detector are mounted on their metalized pads, the optical paths among the devices and through the optical elements are in optical alignment as shown more clearly in FIGS. 11A and 11B. The precision mirror, if needed for redirecting light from an edge emitting laser, is considered to be a device for the purposes of this description only because of the way it is mounted using metalized pads and solder as a silicon chip would be mounted. The hologram surface 119 also has the attachment areas 123 that attach the first transparent substrate 111 with a second transparent substrate 121.

Figures 11A, 11B:
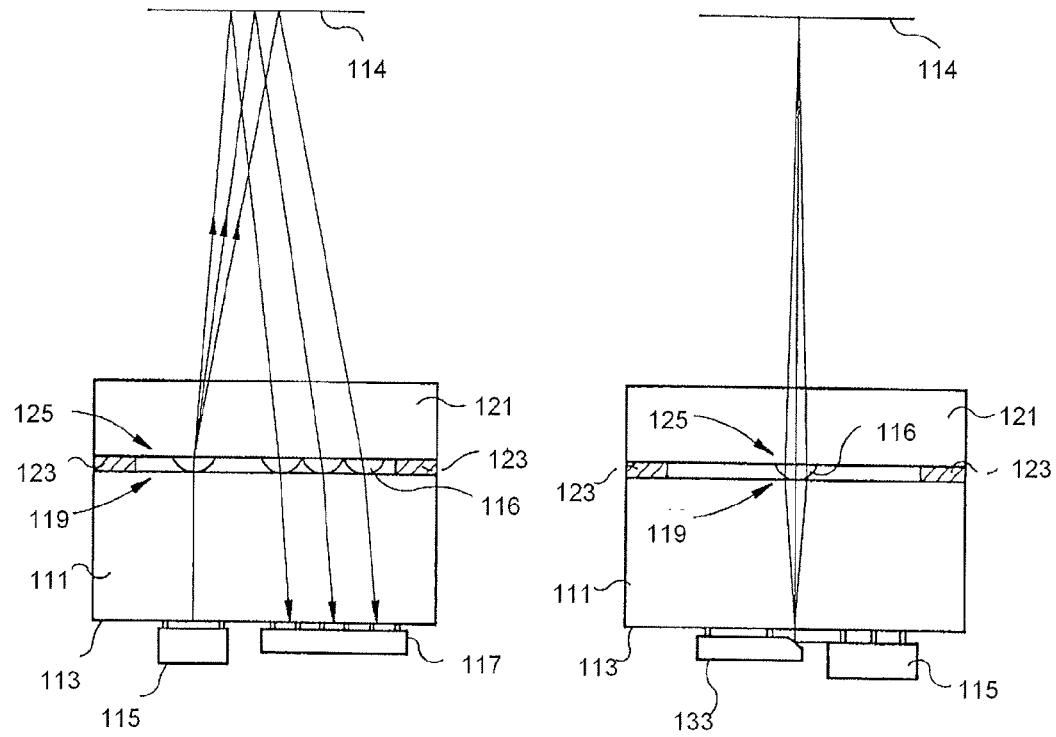
FIG. 11A illustrates a side elevational view of an integrated optical apparatus according to an embodiment.
FIG. 11B illustrates side elevational view of the integrated optical apparatus as shown in FIG. 11A rotated ninety degrees.

The second substrate 121 carries the refractive optics in a surface 125 that provides the second lens of lens pairs or doublets. Light from laser 115 is shaped and split by a diffractive optical element in hologram surface 119 into five separate beams of light that are directed through substrate and travel approximately 2.4 mm to the media. Only the chief ray of each beam is shown in FIG. 11A for clarity of the description. One beam is used for intensity feedback to control the electrical power to laser 115. The other four beams are used for media position or tracking detection. The beams of coherent light are reflected from media 114 and return through second substrate 121 and first substrate 111 to be detected by detector 117. Since the elements are all in their designed optical alignment by virtue of the placement of the metalization pads, there is no need to energize the laser and move the elements relative to each other to bring them into optical alignment. In other words, passive alignment is used rather than the active alignment requiring operation of the laser as in the prior art. It will be recognized that although the beams preferably pass first through the diffractive optical element in surface 119, the order of the optical elements in the light path could be changed or the elements could be combined into one more complex element without departing from the scope of the invention.

FIG. 11B is another side view of the assembly of FIG. 11A. As shown in FIG. 11B, the light emitted by edge emitting laser 115 comes out substantially parallel to the plane of component surface 113 and must be directed normal to the component surface by the 45 degree surface of mirror 133. The light can then pass through substrate 111, a diffractive optical element in surface 119, a refractive lens 116 in surface 125, substrate 121 and be reflected from media 114 as shown in FIGS. 9A-9C and 11A.

Figure 12A:
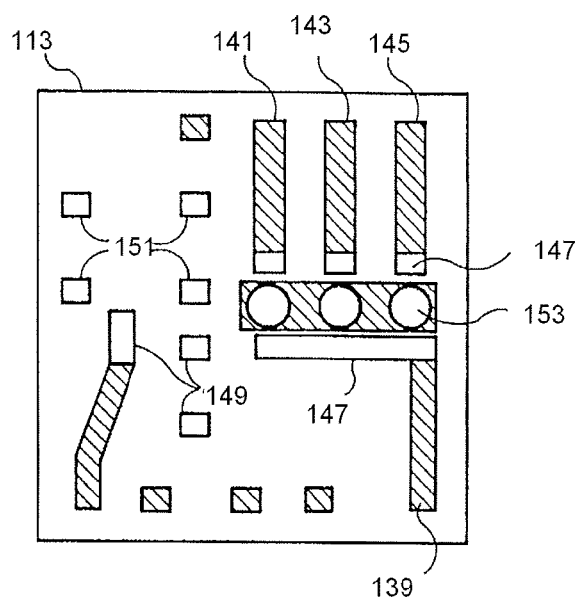
FIG. 12A illustrates a plan view of the component side of a first transparent substrate of an integrated optical apparatus according to an embodiment.

FIG. 12A is a plan top view of the component surface 113 looking down through transparent substrate 111. Electrical contact metalizations 139, 141, 143 and 145 provide electrical connections to detecting photo-diodes in detector 117. Centered under detector 117 is a metalized area 153 having three apertures through which light reflected from media 114 is received. Solder ball alignment areas 147 on each side of area 53 serve both as electrical contacts and as alignment mechanisms in this embodiment. The areas 149 are also solder balls or pads which serve to align and connect the laser 115 to the first substrate and provide current to laser 115. Areas 151 on the other hand only provide mechanical alignment and mechanical attachment of mirror 133 to first transparent substrate 111.

The hologram surface 119 appears in FIG. 12B in plan view, again looking down onto substrate 111. Hologram surface 119 has metalized area 155 which acts as a mask to reduce stray light but allow three beams created by diffractive optics from the light from laser to be directed to media 114 from which they are reflected to reach detector 117 through the five apertures shown in metalized areas 159. Surrounding metalized area 155 is a diffraction grating 157 that scatters stray light from laser 115 so that it does not adversely affect detector 117.

Figure 12B:
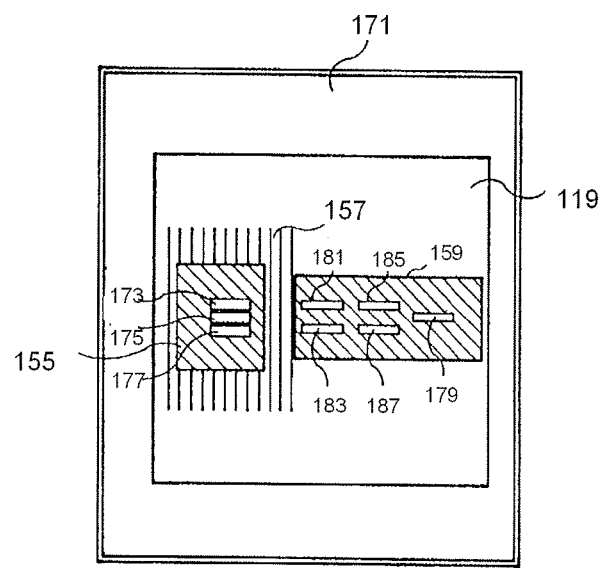
FIG. 12B illustrates a plan view of a holographic optical element of a first transparent substrate of an integrated optical apparatus according to an embodiment.
Figure 12C:
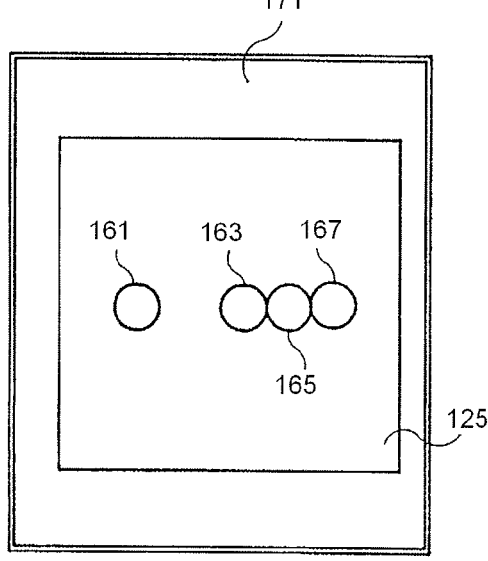
FIG. 12C illustrates a plan view of a refractive lens surface of a second transparent substrate of an integrated optical apparatus according to an embodiment.

FIG. 12C shows the refractive lens surface 125, again in plan view looking down, this time through substrate 121. Lens 161 in combination with the diffractive optical elements in mask 155 shape and focus the laser light into three spots of approximately 20 mm diameter and spaced at approximately 100 microns onto media 14. Lenses 163 and 165 focus the light reflected from media 114 through mask 159 to detector 117 for position control and/or reading. Lens 167 focuses reflected light to the photo-diode of detector 117 that provides an intensity level signal to the power control circuits which control the electrical power provided to laser 15. Surrounding both surface 119 and surface 125 is an attachment area shown generally as area 171 in FIGS. 12B and 12C. Area 171 contains spacing stand off benches and is the area in which an adhesive is placed in order to join substrate 121. The standoff benches passively define a proper or desired vertical spacing or alignment. Preferably the adhesive is ultraviolet light cured adhesive that can be laid down without concern for time to harden. The adhesive is placed in areas 171 and then after the substrates 111 and 121 are aligned, the assembly is flooded with ultra-violet light to catalyze the adhesive. In an alternate embodiment, the adhesive is replaced with photolithographically placed metalization pads and the two substrates are joined using solder ball technology.

FIG. 12B also shows three diffractive optical elements 173, 175 with mask 155. These three elements 135 provide the five beams of light to be reflected from the media, the three main rays of which are shown in FIG. 11A. Element 175 provides the power control beam that is reflected from the media and is received at aperture 179 in mask 159 as shown in FIG. 12B. Elements 173 and 177 each provide two beams that interfere at the media surface to create a dark band with two light bands on either side of the dark bands. The light bands are reflected back down to the pairs of apertures 181, 183 and 185, 187 shown in FIG. 12C to provide the varying light intensity that is used to detect an optical track on the media. The apertures 173, 175 and 177 containing diffractive elements are each approximately 100 microns long and 20 microns wide.

Figure 13:
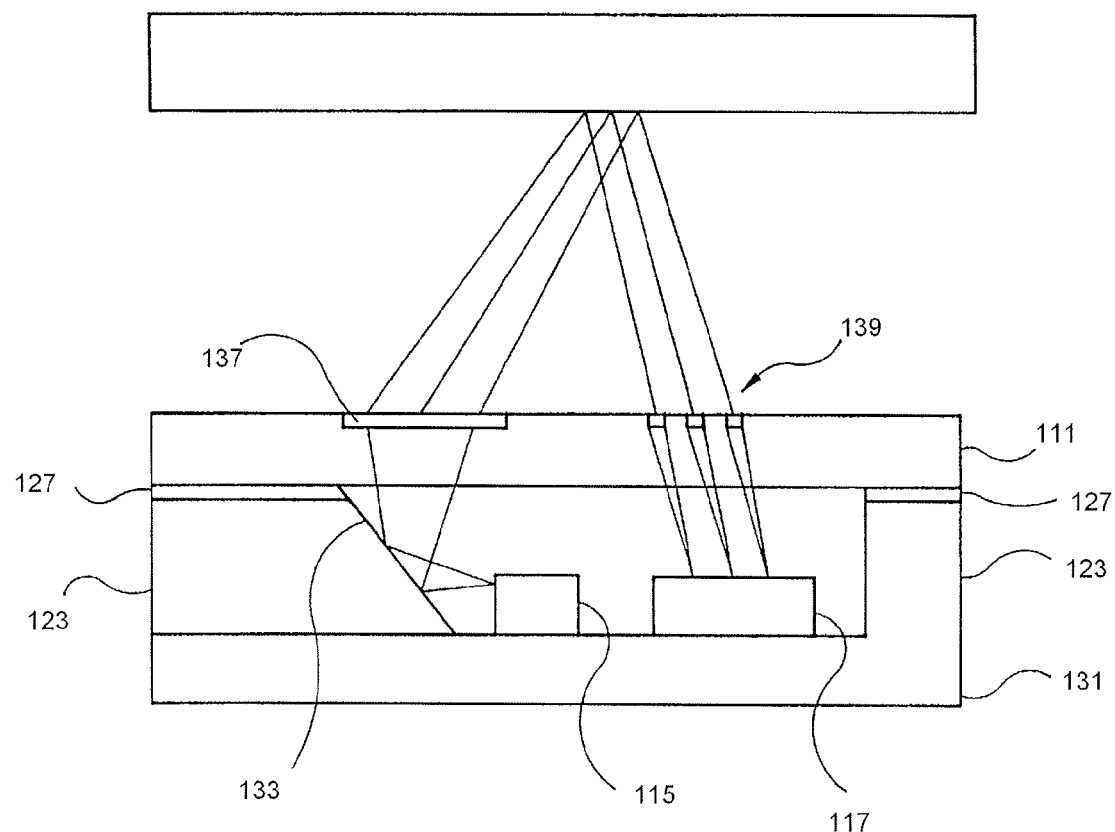
FIG. 13 illustrates a cross sectional view of an integrated optical apparatus of an embodiment having a diffractive element in the transmit path and separate diffractive elements in the return path.

FIG. 13 illustrates an alternative to providing separate refractive elements in each return path. In FIG. 13, each refractive element in the return path has been replaced with a diffractive element 39. The refractive element in the transmit path has also been replaced with a diffractive element 137 for splitting radiation output by the radiation source 115, and delivered to the diffractive element 137 via the precision mirror 133. The diffractive element 137 provides separation to the beams delivered to the grating on the surface 114. The use of diffractive elements in the return path is typically not as advantageous as refractive elements. The diffractive elements are more wavelength dependent and less efficient for larger angles.

Figure 14:
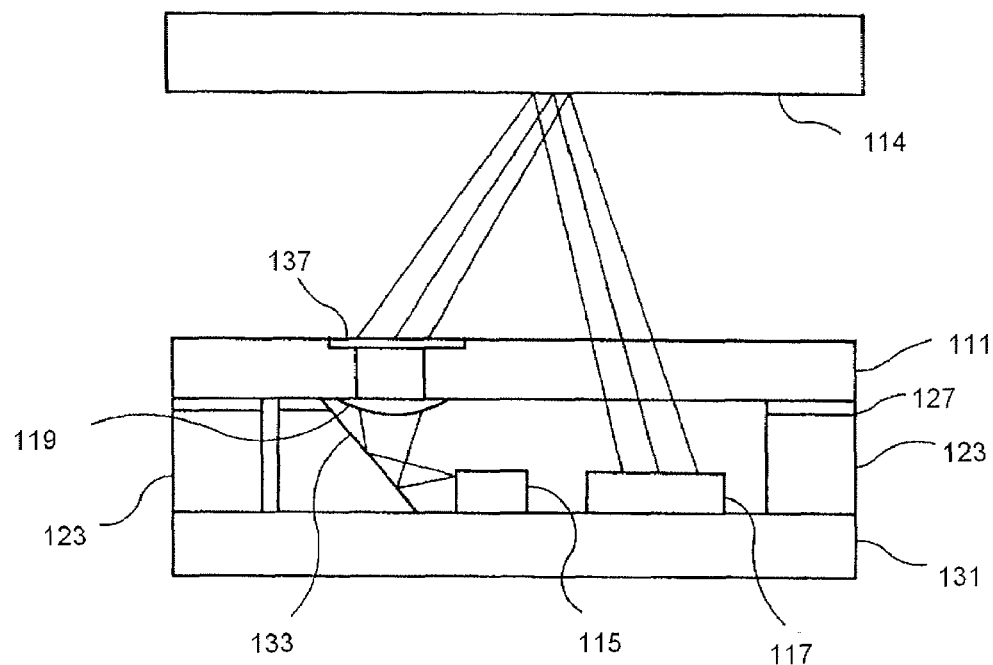
FIG. 14 illustrates a cross sectional view of an integrated optical head of an embodiment having a diffractive element and a refractive element on a single substrate in the transmit path and no optical elements in the return path.
Figure 15:
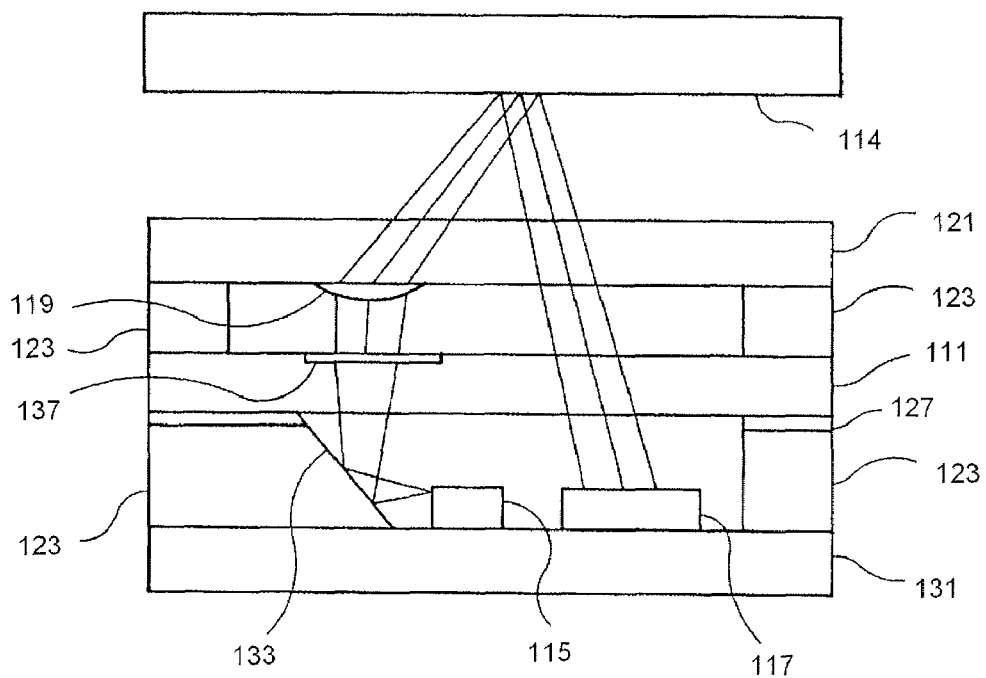
FIG. 15 illustrates a cross sectional view of an integrated optical head of an embodiment having a diffractive element and a refractive element on two substrates in the transmit path and no optical elements in the return path.

Also in FIG. 13, as well as FIGS. 14-15, the active elements are mounted on a support substrate 131, preferably a silicon substrate. This support substrate 131 also serves as a heat sink for the active elements mounted thereon. Attachment areas 123 separate the substrate 131 from the substrate 111 on which the diffractive elements 137, 139 are mounted. The active elements may be mounted support substrate 131 using passive alignment in a similar manner as discussed above regarding the mounting of these elements on the transparent substrate 111. The attachment areas 123 can be provided by etching a recess into the support substrate 131 in which the laser 115, the detector 117, and the optional mirror 133 may be provided. In other words, the unetched portions of the substrate 131 serve as attachment areas 123. The substrates 111, 131 may then be bonded with solder material 127. Further, an angled sidewall of the substrate adjacent the recess therein can serve as the mirror 133. Alternately, the attachment areas 123 may include spacer block separate from the substrate 131, as shown in FIGS. 14 and 15. The mirror 133 can be a separate element from the spacer blocks, as shown in FIG. 14 or can itself serve as a spacer block, as shown in FIG. 15.

As shown in FIG. 14, another embodiment of the present invention is directed to employing no optical elements in the return path. The diffractive element 137 in the transmit path is designed to provide sufficient spread to the radiation such that the beams incident on the detector 117 are still distinguishable. This is facilitated by the provision of a refractive element 119 on an opposite surface of the substrate 111 from the diffractive element.

FIG. 15 illustrates yet another embodiment in which no optical elements are used in the transmit path. In FIG. 15, the refractive element 119 is mounted opposite the diffractive element 137 on a further substrate 121.

Alternatively, a single surface hybrid element as illustrated in FIG. 8 may be used in the transmit path, for example, in place of the two surface hybrid element shown in FIG. 14.

In the structures of all of the figures discussed throughout having more than one substrate, all of the substrates may be passively aligned and attached using patterns formed photolithographically as discussed below. While the following discussion references the transparent substrates 111, 121, the support substrate 131 may also be aligned in an analogous fashion. When aligning the support substrate containing active elements, the integrated optical apparatuses shown in FIGS. 13-15 may be formed by passively aligning a support wafer having a plurality of active elements thereon with a transparent wafer having a corresponding plurality of optical elements. This support-transparent wafer pair may then be diced apart. Alternatively, the support wafer can be diced and individual laser/detector assemblies aligned and attached to the transparent wafer such as by flip-chip attachment. By first forming individual active assemblies, the lasers can be tested separately.

Figure 16:
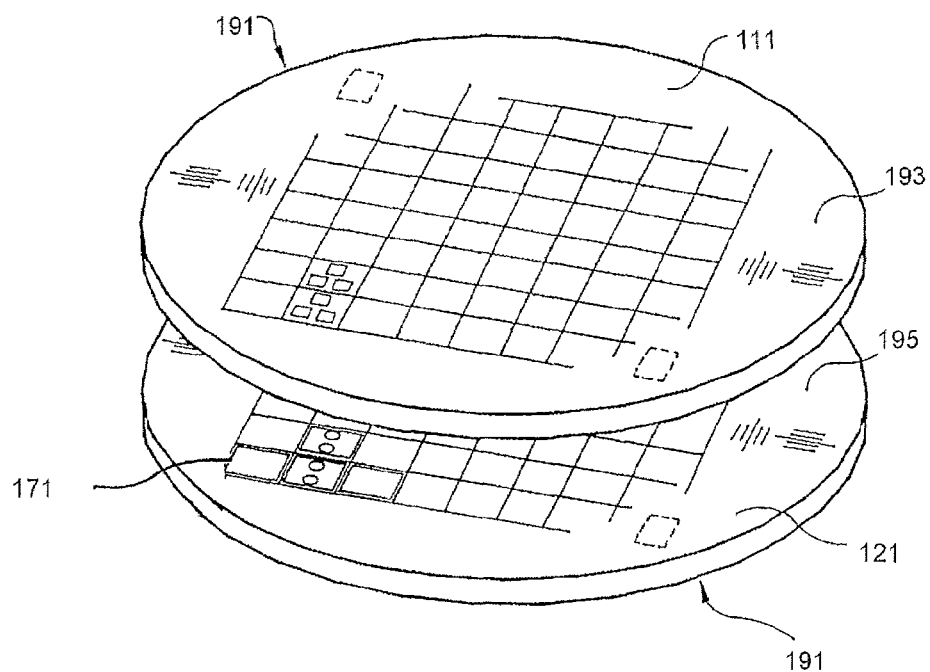
FIG. 16 illustrates a perspective view showing an article including two wafers according to an embodiment.

FIG. 16 shows the two transparent substrates 111 and 121 prior to their being assembled into optical assemblies and diced. Because each element has been accurately placed on each substrate using photolithography, the entire wafers can be aligned and joined prior to being diced into chips without the need to energize any of the laser devices on the substrate 111. FIG. 16 shows the substrates inverted from the way they are shown in FIGS. 10, 11A and 11B in order to show the lasers, mirrors and detectors in place on top of each die. Of course, if the support substrate 131 being aligned with one or both of the transparent substrates, to form the configurations shown in FIGS. 13-15, these active elements are not on the top of the wafer 111.

Prior to putting the wafers together, the adhesive material, e.g., ultra-violet curable solder, is placed in the area 171 of each die on at least one of the wafers. After the adhesive is placed, the two wafers are placed one above the other and aligned. In one embodiment of the invention, a known photolithographic mask aligning tool is used with vernier fiduciary marks 193 and 195 to monitor the relative displacement of the two substrates until they are in alignment with each other. The substrate 111 can then be lowered onto substrate 121, the alignment—rechecked, and the adhesive catalyzed by ultraviolet light.

Figure 17A:
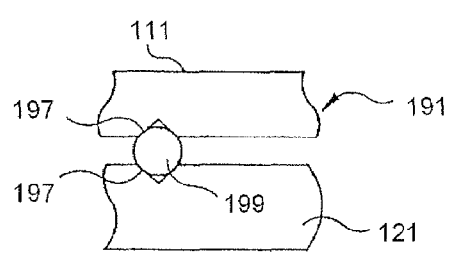
FIGS. 17A-17D illustrate vertical fragmentary sectional views of example alignment features according to an embodiment.

In another embodiment, the two wafers are passively aligned using mechanical mating elements 191. Three forms of mechanical mating elements, in addition to the spacer block previously discussed, are contemplated and shown in FIGS. 17A, 17B and 17C. One, shown in FIG. 17A, takes the form of V-shaped grooves 197 etched into matching faces of the substrates 111 and 121. These grooves 197 are then aligned with sphere 199 to index the two wafers into alignment. Note that only a few grooves and spheres are needed to align all of the dies while they are still together as a wafer. Another embodiment of the alignment means, shown in FIG. 17B, comprises photolithographically placed metalization pads 201 which are then connected by reflowing a solder ball 203. Alternatively, the metalization pads 201 may be solder, without the need for the solder ball 203. In a still further embodiment of FIG. 17C, a bench 205 is raised by etching the surrounding surface and the bench 205 is indexed into a recess 207, also created by photolithographically placed etchant, preferably reactive ion etchant.

Figure 17B:
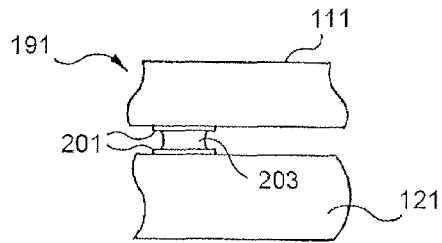
Figure 17C:
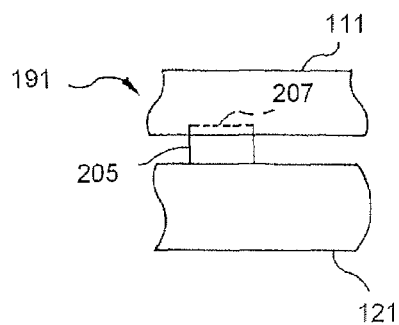
Figure 17D:
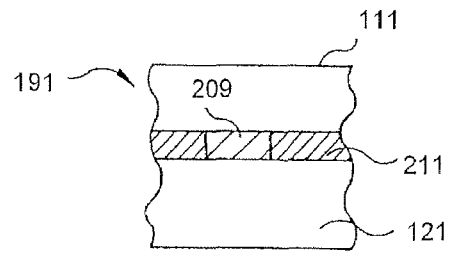

In the adhesive area 171 of each die, means may be needed to accurately space the two substrates from each other. Spacing is accomplished in one embodiment by means of a bench 209 shown in FIG. 17D. Three or more benches 209 may be located in the area 171 around each die in an adhesive with high compressive. In another embodiment, the solder bumps or balls and metalizations are used in area 203 accomplishing both attachment and alignment as shown in FIG. 17B. Alternately, when an adhesive with high compressive strength is chosen, only three or more such benches are needed for spacing the entire wafers and after the adhesive has set, the joined wafers can be diced without substrate spacing.

Having described the invention in terms of preferred embodiments thereof, it will be recognized by those skilled in the art of optical system design that various further changes in the structure and detail of the implementations described can be made without departing from the spirit and scope of the invention. By way of example, the diffractive optical elements may be placed on the same surface of a substrate on which the electronic components are accurately placed with these diffractive optical elements using photolithography. Likewise refractive optical elements may be placed using photolithography in alignment on the other surface of the same substrate thereby allowing an entire optical assembly to be fabricated using but one substrate without the need for actively energizing a light source in the assembly to accomplish alignment.

The invention being thus described, it would be obvious that the same may be varied in many ways. Such variations are not regarded as a departure from the spirit and scope of the invention, and such modifications as would be obvious to one skilled in the art are intended to be included within the scope of the following claims.

What is claimed is:

1. An integrated optical imaging system, comprising:
   a first substrate having first and second opposing surfaces;
   a second substrate having third and fourth opposing surfaces;
   a spacer between a substantially planar portion of the third surface of the second substrate and a substantially planar portion of the second surface of the first substrate, the spacer having a hole therein to define an interior space between the first and second substrate, and at least two of the spacer, the first substrate and the second substrate sealing the interior space between the third surface of the second substrate and the second surface of the first substrate;
   an optical imaging system having n surfaces, where n is greater than or equal to two, at least one of the n surfaces of the optical imaging system is on respective ones of the first, second, third and fourth surfaces;
   an optoelectronic device on one of the third and fourth surfaces, wherein a periphery of the spacer is equal to or less than a periphery of both the first and second substrates; and
   at least one metalization pad on a respective one of the first, second, third, and fourth surfaces, the metallization pad being configured to indicate an alignment position with respect to a predetermined element, and at least one of the optical imaging system and the optoelectronic device is connected to a respective one of the first, second, third, and fourth surfaces via the metalization pad.

2. The integrated optical imaging system as claimed in claim 1, wherein the optical imaging system is on at least two of the first, second, third and fourth surfaces.

3. The integrated optical imaging system as claimed in claim 1, wherein the spacer is bonding material between the first and second substrates.

4. The integrated optical imaging system as claimed in claim 1, wherein the spacer is opaque.

5. The integrated optical imaging system as claimed in claim 1, wherein the optoelectronic device is a detector in optical communication with the optical imaging system.

6. The integrated optical imaging system as claimed in claim 5, wherein the detector is within the interior space.

7. The integrated optical imaging system as claimed in claim 5, wherein the detector is an array of detectors.

8. The integrated optical imaging system as claimed in claim 7, wherein the optical imaging system includes an array of lenses, each lens associated with a corresponding detector.

9. The integrated optical imaging system as claimed in claim 8, wherein the array of lenses is within the interior space.

10. The integrated optical imaging system as claimed in claim 7, wherein each lens focuses an image on the corresponding detector.

11. The integrated optical imaging system as claimed in claim 1, further comprising a third substrate having fifth and sixth surfaces, the third substrate being adjacent the first surface of the first substrate.

12. The integrated optical imaging system as claimed in claim 11, wherein the optical imaging system is on at least one of the fifth and sixth surfaces of the third substrate.

13. The integrated optical imaging system as claimed in claim 11, wherein the first through third substrates are secured together.

14. The integrated optical imaging system as claimed in claim 13, wherein at least two of the first through third substrates are secured on a wafer level.

15. The integrated optical imaging system as claimed in claim 14, wherein the first and second substrates and the spacer are aligned along a z-axis.

16. The integrated optical imaging system as claimed in claim 11, further comprising a second spacer between the third substrate and the first substrate.

17. The integrated optical imaging system as claimed in claim 1, wherein the optical imaging system includes a refractive element.

18. The integrated optical imaging system as claimed in claim 17, wherein the refractive element is a replica.

19. The integrated optical imaging system as claimed in claim 1, wherein the optical imaging system includes first and second optical elements in a same optical path and on different ones of the first through fourth surfaces, the first optical element being a replica and the second optical element being a lithograph.

20. The integrated optical imaging system as claimed in claim 1, wherein at least two of the n surfaces of the optical imaging system are on respective ones of the first, second, third and fourth surfaces.

21. The integrated optical imaging system as claimed in claim 1, wherein peripheries of the spacer and at least one of the first and second substrates are coextensive along a z-axis.

22. The integrated optical imaging system as claimed in claim 21, wherein the second substrate is coextensive with the first substrate and the spacer along the z-axis.

23. A method of forming an integrated optical imaging system, comprising:
providing a first substrate having first and second opposing surfaces;
providing a second substrate having third and fourth opposing surfaces;
providing a spacer between a substantially planar portion of the third surface of the second substrate and a substantially planar portion of the second surface of the first substrate, the spacer including a hole therein to define an interior space between the first and second substrates, at least two of the spacer, the first substrate and the second substrate sealing the interior space between the third surface of the second substrate and the second surface of the first substrate;
providing an optical imaging system having n surfaces, where n is greater than or equal to two, at least one of the n surfaces of the optical imaging system is on respective ones of the first, second, third and fourth surfaces;
providing an optoelectronic device on one of the third and fourth surfaces;
forming at least one metalization pad on a respective one of the first, second, third, and fourth surfaces, such that the metallization pad being configured to indicate an alignment position with respect to a predetermined element, and at least one of the optical imaging system and the optoelectronic device is connected to a respective one of the first, second, third, and fourth surfaces via the metalization pad; and
securing at least two of the first and second substrates and the spacer on a wafer level, a periphery of the spacer being equal to or less than a periphery of both the first and second substrates.

24. The method as claimed in claim 23, further comprising passively aligning the first substrate, the second substrate, and the spacer.

25. The method as claimed in claim 23, wherein at least two of the n surfaces of the optical imaging system are on respective ones of the first, second, third and fourth surfaces.

26. The method as claimed in claim 23, wherein securing includes securing the second substrate with the first substrate and the spacer on a wafer level, such that after separation from respective wafers, peripheries of the spacer, the first substrate and the second substrate are coextensive along a z-axis.

27. The method as claimed in claim 23, wherein providing the optoelectronic device includes providing the optoelectronic device in the interior space.

28. The method as claimed in claim 23, wherein the optoelectronic device is a detector.

29. The method as claimed in claim 23, wherein after separation from respective wafers, peripheries of the spacer and at least one of the first and second substrate are coextensive along a z-axis.

* * * * *

UNITED STATES PATENT AND TRADEMARK OFFICE
CERTIFICATE OF CORRECTION

| | | |
|---|---|---|
| PATENT NO. | : 8,153,957 B2 | Page 1 of 1 |
| APPLICATION NO. | : 11/928060 | |
| DATED | : April 10, 2012 | |
| INVENTOR(S) | : Michael R. Feldman et al. | |

It is certified that error appears in the above-identified patent and that said Letters Patent is hereby corrected as shown below:

In the Specification

Column 1, First Paragraph, lines 9-10 should read:

This application claims the benefit of priority under
35 U.S.C. §120 to U.S. applications Ser. No. 08/727,837, filed In the Claims

Column 20, claim 1, lines 16-24 should read:

a spacer between a substantially planar portion of the third surface of the second substrate and a
  substantially planar portion of the second surface of the first substrate, the spacer having a
  hole therein to define an interior space between the first and second substrates, and at least
  two of the spacer, the first substrate and the second substrate sealing the interior space
  between the third surface of the second substrate and the second surface of the first substrate;

Signed and Sealed this
Seventh Day of October, 2014

Michelle K. Lee
*Deputy Director of the United States Patent and Trademark Office*

UNITED STATES PATENT AND TRADEMARK OFFICE
CERTIFICATE OF CORRECTION

PATENT NO. : 8,153,957 B2  
APPLICATION NO. : 11/928060  
DATED : April 10, 2012  
INVENTOR(S) : Michael R. Feldman et al.

Page 1 of 1

It is certified that error appears in the above-identified patent and that said Letters Patent is hereby corrected as shown below:

On the Title page Item (63) Add:

Related U.S. Application Data

(63) Continuation-in-part of application No. 08/727,837, filed on Sep. 27, 1996, now Pat. No. 5,771,218, Continuation-in-part of application No. 08/917,865, filed on Aug. 27, 1997, now Pat. No. 6,128,134, Continuation-in-part of application No. 08/943,274, filed on Oct. 3, 1997, now Pat. No. 6,096,155, Continuation-in-part of application No. 09/018,891, filed on Feb. 5, 1998, now Pat. No. 5,912,872, Continuation-in-part of application No. 09/503,249, filed on Feb. 14, 2000, now Pat. No. 6,610,166, Continuation-in-part of application No. 09/637,364, filed on Aug. 15, 2000, now Pat. No. 6,522,618, Continuation-in-part of application No. 10/647,262, filed on Aug. 26, 2003.

Signed and Sealed this  
Twenty-seventh Day of January, 2015

Michelle K. Lee  
*Deputy Director of the United States Patent and Trademark Office*